(12) United States Patent
Song et al.

(10) Patent No.: US 11,493,552 B2
(45) Date of Patent: Nov. 8, 2022

(54) DISPLAY PANEL TEST CIRCUIT

(71) Applicant: Samsung Display Co., Ltd., Yongin-Si (KR)

(72) Inventors: Hwayoung Song, Asan-si (KR); Seungwoo Sung, Cheonan-si (KR); Dong Eup Lee, Asan-si (KR); Seungji Cha, Seoul (KR); Kimyeong Eom, Suwon-si (KR); Kwangsae Lee, Asan-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/191,581

(22) Filed: Mar. 3, 2021

(65) Prior Publication Data

US 2021/0286002 A1 Sep. 16, 2021

(30) Foreign Application Priority Data

Mar. 10, 2020 (KR) .................. 10-2020-0029468

(51) Int. Cl.
*G01R 31/317* (2006.01)
*G09G 3/20* (2006.01)

(52) U.S. Cl.
CPC ..... *G01R 31/31712* (2013.01); *G09G 3/2003* (2013.01); *G09G 2300/0452* (2013.01); *G09G 2330/12* (2013.01)

(58) Field of Classification Search
None
See application file for complete search history.

(56) References Cited

U.S. PATENT DOCUMENTS

| 2011/0043500 A1* | 2/2011 | Kwak | G09G 3/006 345/206 |
| 2014/0111407 A1* | 4/2014 | Kwon | H01L 51/0031 345/82 |
| 2014/0240521 A1* | 8/2014 | Kwak | H04N 17/004 348/189 |
| 2014/0354285 A1* | 12/2014 | Kim | G01R 31/44 324/414 |

(Continued)

FOREIGN PATENT DOCUMENTS

| KR | 10-1101070 B1 | 12/2011 |
| KR | 10-1224458 B1 | 1/2013 |

(Continued)

*Primary Examiner* — Patrick N Edouard
*Assistant Examiner* — Peijie Shen
(74) *Attorney, Agent, or Firm* — Innovation Counsel LLP

(57) ABSTRACT

A display panel test circuit includes a first transistor connected to a first data line and receiving a red lighting test signal, a second transistor connected to the first data line and receiving a blue lighting test signal, a third transistor connected to a second data line and receiving a first green lighting test signal, a fourth transistor connected to a third data line and receiving the red lighting test signal, a fifth transistor connected to the third data line and receiving the blue lighting test signal, a sixth transistor connected to a fourth data line and receiving a second green lighting test signal, a seventh transistor connected to the second data line and receiving a crack test signal, and an eighth transistor connected to the fourth data line and receiving the crack test signal. The display panel test circuit performs one or more tests on a display panel.

20 Claims, 10 Drawing Sheets

(56) References Cited

U.S. PATENT DOCUMENTS

| | | | | |
|---|---|---|---|---|
| 2015/0090961 A1* | 4/2015 | Lee | ............... | G09G 3/006 |
| | | | | 257/40 |
| 2016/0104402 A1* | 4/2016 | Kim | ............... | G09G 3/006 |
| | | | | 324/762.07 |
| 2016/0260367 A1* | 9/2016 | Kwak | ............... | G09G 3/006 |
| 2016/0343279 A1* | 11/2016 | Oke | ............... | G09G 3/3611 |
| 2018/0076102 A1* | 3/2018 | Ka | ............... | H01L 29/7869 |
| 2018/0182274 A1* | 6/2018 | Jung | ............... | G09G 3/006 |
| 2020/0327834 A1* | 10/2020 | Kim | ............... | G09G 3/2074 |
| 2020/0394947 A1* | 12/2020 | Hao | ............... | G09G 3/2003 |
| 2021/0012701 A1* | 1/2021 | Zhou | ............... | G09G 3/006 |

FOREIGN PATENT DOCUMENTS

| | | |
|---|---|---|
| KR | 10-1585253 B1 | 1/2016 |
| KR | 10-2016-0108639 A | 9/2016 |
| KR | 10-2018-0076417 A | 7/2018 |

\* cited by examiner

FIG. 3

|  | DC LIGHTING TEST | OS TEST1 | OS TEST2 | MCD TEST |
|---|---|---|---|---|
| TEST_GATE_R | L | L | L | L(H) |
| TEST_GATE_G1 | L | H | L | H |
| TEST_GATE_G2 | L | L | H | H |
| TEST_GATE_B | L | H | H | H(L) |
| DC_R | L | H | L | H |
| DC_G | L | L | L | H |
| DC_B | L | L | H | H |
| MCD_GATE | H | L | L | L |
| VGH | X | H | H | H |

FIG. 8

|  | DC LIGHTING TEST | OS TEST1 | OS TEST2 | MCD TEST | DFT TEST |
|---|---|---|---|---|---|
| TEST_GATE_R | L | H | H | H | H |
| TEST_GATE_G | L | L | L | H | H |
| TEST_GATE_B | L | H | H | H | H |
| DC_R | L | H | H | H | H |
| DC_B | L | H | H | H | H |
| MCD_GATE | H | H | H | L | H |
| TEST_GATE_OS | H | L | L | L | H |
| TEST_DATA1 | DC_G | H | L | H | H |
| TEST_DATA2 | DC_G | L | H | H | H |
| DFT_GATE | H | H | H | H | L |
| VGH | X | H | H | H | H |

DISPLAY PANEL TEST CIRCUIT

CROSS-REFERENCE TO RELATED APPLICATION

This application claims priority under 35 U.S.C. § 119 to Korean Patent Application No. 10-2020-0029468 filed on Mar. 10, 2020 in the Korean Intellectual Property Office (KIPO), the disclosure of which is incorporated herein by reference in its entirety.

BACKGROUND

1. Field

The present disclosure relates generally to a display device. More particularly, the present disclosure relates to a display panel test circuit that can perform a pre-lighting test, a lighting test, an open-short test, and a crack test on a display panel included in a display device.

2. Description of the Related Art

Generally, a display device includes a display panel including a plurality of pixels and a display panel driving circuit that drives the display panel. A single pixel may include a red sub-pixel, a green sub-pixel, and a blue sub-pixel. For example, the pixel may have an RGB structure in which one red sub-pixel, one blue sub-pixel, and one green sub-pixel are arranged in a row or a pentile structure in which one red sub-pixel, one blue sub-pixel, and two green sub-pixels are arranged. Recently, as resolution of a display device increases, a pixel having the pentile structure that is more suitable for relatively high resolution has been widely used.

To perform various tests on a display panel in a manufacturing process of a display device, a display panel test circuit may include a pre-lighting test circuit, a lighting test circuit, an open-short test circuit, and a crack test circuit. Since the display panel test circuit occupies a space of a non-display region (e.g., a lower region) of the display panel although the display panel test circuit may not be used after the display device is manufactured, the space occupied by the display panel test circuit may be regarded as a dead space of the display panel, and it may make a bezel of the display device wider. Particularly, a conventional display panel test circuit that has a structure in which the pre-lighting test circuit, the lighting test circuit, the open-short test circuit, and the crack test circuit are individually and independently configured may increase the dead space of the display panel.

SUMMARY

The present disclosure provides a display panel test circuit integrating at least two test circuits among a pre-lighting test circuit that performs a pre-lighting test on a display panel, a lighting test circuit that performs a lighting test on the display panel, an open-short test circuit that performs an open-short test on the display panel, and a crack test circuit that performs a crack test on the display panel.

According to an embodiment, a display panel test circuit may include a first transistor including a first terminal connected to a first data line to which a first red sub-pixel and a first blue sub-pixel are connected, a gate terminal that receives a red lighting test signal, and a second terminal connected to a red lighting voltage line that supplies a red lighting voltage, a second transistor including a first terminal connected to the first data line, a gate terminal that receives a blue lighting test signal, and a second terminal connected to a blue lighting voltage line that supplies a blue lighting voltage, a third transistor including a first terminal connected to a second data line to which first green sub-pixels are connected, a gate terminal that receives a first green lighting test signal, and a second terminal connected to a green lighting voltage line that supplies a green lighting voltage, a fourth transistor including a first terminal connected to a third data line to which a second red sub-pixel and a second blue sub-pixel are connected, a gate terminal that receives the red lighting test signal, and a second terminal connected to the blue lighting voltage line, a fifth transistor including a first terminal connected to the third data line, a gate terminal that receives the blue lighting test signal, and a second terminal connected to the red lighting voltage line, a sixth transistor including a first terminal connected to a fourth data line to which second green sub-pixels are connected, a gate terminal that receives a second green lighting test signal, and a second terminal connected to the green lighting voltage line, a seventh transistor including a first terminal connected to the second data line, a gate terminal that receives a crack test signal, and a second terminal connected to a crack detection line that passes through a non-display region of a display panel, and an eighth transistor including a first terminal connected to the fourth data line, a gate terminal that receives the crack test signal, and a second terminal connected to the crack detection line.

In an embodiment, the display panel test circuit may perform a lighting test on the display panel based on the red lighting test signal, the blue lighting test signal, the first green lighting test signal, and the second green lighting test signal having a turn-on voltage level, the red lighting voltage, the blue lighting voltage, and the green lighting voltage having a lighting voltage level, and the crack test signal having a turn-off voltage level.

In an embodiment, the display panel test circuit may perform a first open-short test on the display panel based on the red lighting test signal and the second green lighting test signal having a turn-on voltage level, the first green lighting test signal and the blue lighting test signal having a turn-off voltage level, the red lighting voltage having a non-lighting voltage level, the blue lighting voltage and the green lighting voltage having a lighting voltage level, and the crack test signal having the turn-on voltage level.

In an embodiment, the display panel test circuit may perform a second open-short test on the display panel based on the red lighting test signal and the first green lighting test signal having the turn-on voltage level, the second green lighting test signal and the blue lighting test signal having the turn-off voltage level, the blue lighting voltage having the non-lighting voltage level, the red lighting voltage and the green lighting voltage having the lighting voltage level, and the crack test signal having the turn-on voltage level.

In an embodiment, the display panel test circuit may perform a crack test on the display panel based on one of the red lighting test signal and the blue lighting test signal having a turn-on voltage level, another of the red lighting test signal and the blue lighting test signal having a turn-off voltage level, the first green lighting test signal and the second green lighting test signal having the turn-off voltage level, the red lighting voltage, the blue lighting voltage, and the green lighting voltage having a non-lighting voltage level, and the crack test signal having the turn-on voltage level.

In an embodiment, the display panel test circuit may further include a ninth transistor including a first terminal connected to the first data line, a gate terminal that receives a first pre-lighting test signal, and a second terminal connected to a pre-lighting test pad, a tenth transistor including a first terminal connected to the second data line, a gate terminal that receives a second pre-lighting test signal, and a second terminal connected to the pre-lighting test pad, an eleventh transistor including a first terminal connected to the third data line, a gate terminal that receives a third pre-lighting test signal, and a second terminal connected to the pre-lighting test pad, and a twelfth transistor including a first terminal connected to the fourth data line, a gate terminal that receives a fourth pre-lighting test signal, and a second terminal connected to the pre-lighting test pad.

In an embodiment, the display panel test circuit may perform a pre-lighting test on the display panel based on the red lighting test signal, the blue lighting test signal, the first green lighting test signal, and the second green lighting test signal having a turn-off voltage level, the crack test signal having the turn-off voltage level, the first pre-lighting test signal, the second pre-lighting test signal, the third pre-lighting test signal, and the fourth pre-lighting test signal having a turn-on voltage level, and a pre-lighting voltage having a lighting voltage level and applied via the pre-lighting test pad.

In an embodiment, the ninth transistor, the tenth transistor, the eleventh transistor, and the twelfth transistor may be arranged between the green lighting voltage line and the blue lighting voltage line, between the green lighting voltage line and the red lighting voltage line, or between the blue lighting voltage line and the red lighting voltage line.

According to an embodiment, a display panel test circuit may include a first transistor including a first terminal connected to a first data line to which a first red sub-pixel and a first blue sub-pixel are connected, a gate terminal that receives a red lighting test signal, and a second terminal connected to a red lighting voltage line that supplies a red lighting voltage, a second transistor including a first terminal connected to the first data line, a gate terminal that receives a blue lighting test signal, and a second terminal connected to a blue lighting voltage line that supplies a blue lighting voltage, a third transistor including a first terminal connected to a second data line to which first green sub-pixels are connected, a gate terminal that receives a first green lighting test signal, and a second terminal connected to both a pre-lighting test pad and a green lighting voltage line that supplies a green lighting voltage, a fourth transistor including a first terminal connected to a third data line to which a second red sub-pixel and a second blue sub-pixel are connected, a gate terminal that receives the red lighting test signal, and a second terminal connected to the blue lighting voltage line, a fifth transistor including a first terminal connected to the third data line, a gate terminal that receives the blue lighting test signal, and a second terminal connected to the red lighting voltage line, a sixth transistor including a first terminal connected to a fourth data line to which second green sub-pixels are connected, a gate terminal that receives a second green lighting test signal, and a second terminal connected to both the pre-lighting test pad and the green lighting voltage line, a seventh transistor including a first terminal connected to the second data line, a gate terminal that receives a crack test signal, and a second terminal connected to a crack detection line that passes through a non-display region of a display panel, an eighth transistor including a first terminal connected to the fourth data line, a gate terminal that receives the crack test signal, and a second terminal connected to the crack detection line, a ninth transistor including a first terminal connected to the first data line, a gate terminal that receives a first pre-lighting test signal, and a second terminal connected to both the pre-lighting test pad and the green lighting voltage line, and a tenth transistor including a first terminal connected to the third data line, a gate terminal that receives a second pre-lighting test signal, and a second terminal connected to both the pre-lighting test pad and the green lighting voltage line.

In an embodiment, the display panel test circuit may perform a lighting test on the display panel based on the red lighting test signal, the blue lighting test signal, the first green lighting test signal, and the second green lighting test signal having a turn-on voltage level, the red lighting voltage, the blue lighting voltage, and the green lighting voltage having a lighting voltage level, the crack test signal having a turn-off voltage level, and the first pre-lighting test signal and the second pre-lighting test signal having the turn-off voltage level.

In an embodiment, the display panel test circuit may perform a first open-short test on the display panel based on the red lighting test signal and the second green lighting test signal having a turn-on voltage level, the first green lighting test signal and the blue lighting test signal having a turn-off voltage level, the red lighting voltage having a non-lighting voltage level, the blue lighting voltage and the green lighting voltage having a lighting voltage level, the crack test signal having the turn-on voltage level, and the first pre-lighting test signal and the second pre-lighting test signal having the turn-off voltage level.

In an embodiment, the display panel test circuit may perform a second open-short test on the display panel based on the red lighting test signal and the first green lighting test signal having the turn-on voltage level, the second green lighting test signal and the blue lighting test signal having the turn-off voltage level, the blue lighting voltage having the non-lighting voltage level, the red lighting voltage and the green lighting voltage having the lighting voltage level, the crack test signal having the turn-on voltage level, and the first pre-lighting test signal and the second pre-lighting test signal having the turn-off voltage level.

In an embodiment, the display panel test circuit may perform a crack test on the display panel based on one of the red lighting test signal and the blue lighting test signal having a turn-on voltage level, another of the red lighting test signal and the blue lighting test signal having a turn-off voltage level, the first green lighting test signal and the second green lighting test signal having the turn-off voltage level, the red lighting voltage, the blue lighting voltage, and the green lighting voltage having a non-lighting voltage level, the crack test signal having the turn-on voltage level, and the first pre-lighting test signal and the second pre-lighting test signal having the turn-off voltage level.

In an embodiment, the display panel test circuit may perform a pre-lighting test on the display panel based on the red lighting test signal and the blue lighting test signal having a turn-off voltage level, the crack test signal having the turn-off voltage level, the first pre-lighting test signal, the second pre-lighting test signal, the first green lighting test signal, and the second green lighting test signal having a turn-on voltage level, and a pre-lighting voltage having a lighting voltage level and applied via the pre-lighting test pad.

According to an embodiment, a display panel test circuit may include a first transistor including a first terminal connected to a first data line to which a first red sub-pixel and a first blue sub-pixel are connected, a gate terminal that receives a red lighting test signal, and a second terminal connected to a red lighting voltage line that supplies a red lighting voltage, a second transistor including a first terminal connected to the first data line, a gate terminal that receives a blue lighting test signal, and a second terminal connected to a blue lighting voltage line that supplies a blue lighting voltage, a third transistor including a first terminal connected to a second data line to which first green sub-pixels are connected, a gate terminal that receives a green lighting test signal, and a second terminal connected to a first test voltage line that supplies a first test voltage, a fourth transistor including a first terminal connected to a third data line to which a second red sub-pixel and a second blue sub-pixel are connected, a gate terminal that receives the red lighting test signal, and a second terminal connected to the blue lighting voltage line, a fifth transistor including a first terminal connected to the third data line, a gate terminal that receives the blue lighting test signal, and a second terminal connected to the red lighting voltage line, a sixth transistor including a first terminal connected to a fourth data line to which second green sub-pixels are connected, a gate terminal that receives the green lighting test signal, and a second terminal connected to a second test voltage line that supplies a second test voltage, a seventh transistor including a first terminal connected to the second data line, a gate terminal that receives a crack test signal, and a second terminal connected to a crack detection line that passes through a non-display region of a display panel, an eighth transistor including a first terminal connected to the fourth data line, a gate terminal that receives the crack test signal, and a second terminal connected to the crack detection line, a ninth transistor including a first terminal connected to the second data line, a gate terminal that receives a pre-lighting test signal, and a second terminal connected to a first pre-lighting test pad that is connected to the first data line, a tenth transistor including a first terminal connected to the fourth data line, a gate terminal that receives the pre-lighting test signal, and a second terminal connected to a second pre-lighting test pad that is connected to the third data line, an eleventh transistor including a first terminal connected to the first data line, a gate terminal that receives an open-short test signal, and a second terminal connected to the first test voltage line, and a twelfth transistor including a first terminal connected to the third data line, a gate terminal that receives the open-short test signal, and a second terminal connected to the second test voltage line.

In an embodiment, the display panel test circuit may perform a lighting test on the display panel based on the red lighting test signal, the blue lighting test signal, and the green lighting test signal having a turn-on voltage level, the red lighting voltage and the blue lighting voltage having a lighting voltage level, the crack test signal having a turn-off voltage level, the open-short test signal having the turn-off voltage level, the first test voltage and the second test voltage having the lighting voltage level, and the pre-lighting test signal having the turn-off voltage level.

In an embodiment, the display panel test circuit may perform a first open-short test on the display panel based on the green lighting test signal having a turn-on voltage level, the red lighting test signal and the blue lighting test signal having a turn-off voltage level, the red lighting voltage and the blue lighting voltage having a non-lighting voltage level, the crack test signal having the turn-off voltage level, the open-short test signal having the turn-on voltage level, the first test voltage having the non-lighting voltage level, the second test voltage having a lighting voltage level, and the pre-lighting test signal having the turn-off voltage level.

In an embodiment, the display panel test circuit may perform a second open-short test on the display panel based on the green lighting test signal having the turn-on voltage level, the red lighting test signal and the blue lighting test signal having the turn-off voltage level, the red lighting voltage and the blue lighting voltage having the non-lighting voltage level, the crack test signal having the turn-off voltage level, the open-short test signal having the turn-on voltage level, the first test voltage having the lighting voltage level, the second test voltage having the non-lighting voltage level, and the pre-lighting test signal having the turn-off voltage level.

In an embodiment, the display panel test circuit may perform a crack test on the display panel based on the red lighting test signal, the green lighting test signal, and the blue lighting test signal having a turn-off voltage level, the red lighting voltage and the blue lighting voltage having a non-lighting voltage level, the crack test signal having a turn-on voltage level, the open-short test signal having the turn-on voltage level, the first test voltage and the second test voltage having the non-lighting voltage level, and the pre-lighting test signal having the turn-off voltage level.

In an embodiment, the display panel test circuit may perform a pre-lighting test on the display panel based on the red lighting test signal, the green lighting test signal, and the blue lighting test signal having a turn-off voltage level, the red lighting voltage and the blue lighting voltage having a non-lighting voltage level, the crack test signal having the turn-off voltage level, the open-short test signal having the turn-off voltage level, the first test voltage and the second test voltage having the non-lighting voltage level, the pre-lighting test signal having a turn-on voltage level, and a pre-lighting voltage having a lighting voltage level and applied via the pre-lighting test pad.

The display panel test circuit disclosed herein may have a structure in which at least two test circuits among a pre-lighting test circuit that performs a pre-lighting test on a display panel, a lighting test circuit that performs a lighting test on the display panel, an open-short test circuit that performs an open-short test on the display panel, and a crack test circuit that performs a crack test on the display panel are integrated. The display panel including the display panel test circuit may have a reduced dead space as compared to a conventional display panel including a display panel test circuit having a structure in which the pre-lighting test circuit, the lighting test circuit, the open-short test circuit, and the crack test circuit are individually and independently configured. However, the present disclosure is not limited thereto. Thus, the present inventive concept may be extended without departing from the spirit and the scope of the present disclosure.

BRIEF DESCRIPTION OF THE DRAWINGS

Illustrative and non-limiting embodiments of the present disclosure will be more clearly understood from the following detailed description in conjunction with the accompanying drawings.

FIG. 3 is a diagram for describing an operation of the display panel test circuit of FIG. 2.

FIG. 8 is a diagram for describing an operation of the display panel test circuit of FIG. 7.

DETAILED DESCRIPTION OF THE EMBODIMENTS

Hereinafter, embodiments of the present inventive concept will be explained in detail with reference to the accompanying drawings.

Figure 1:
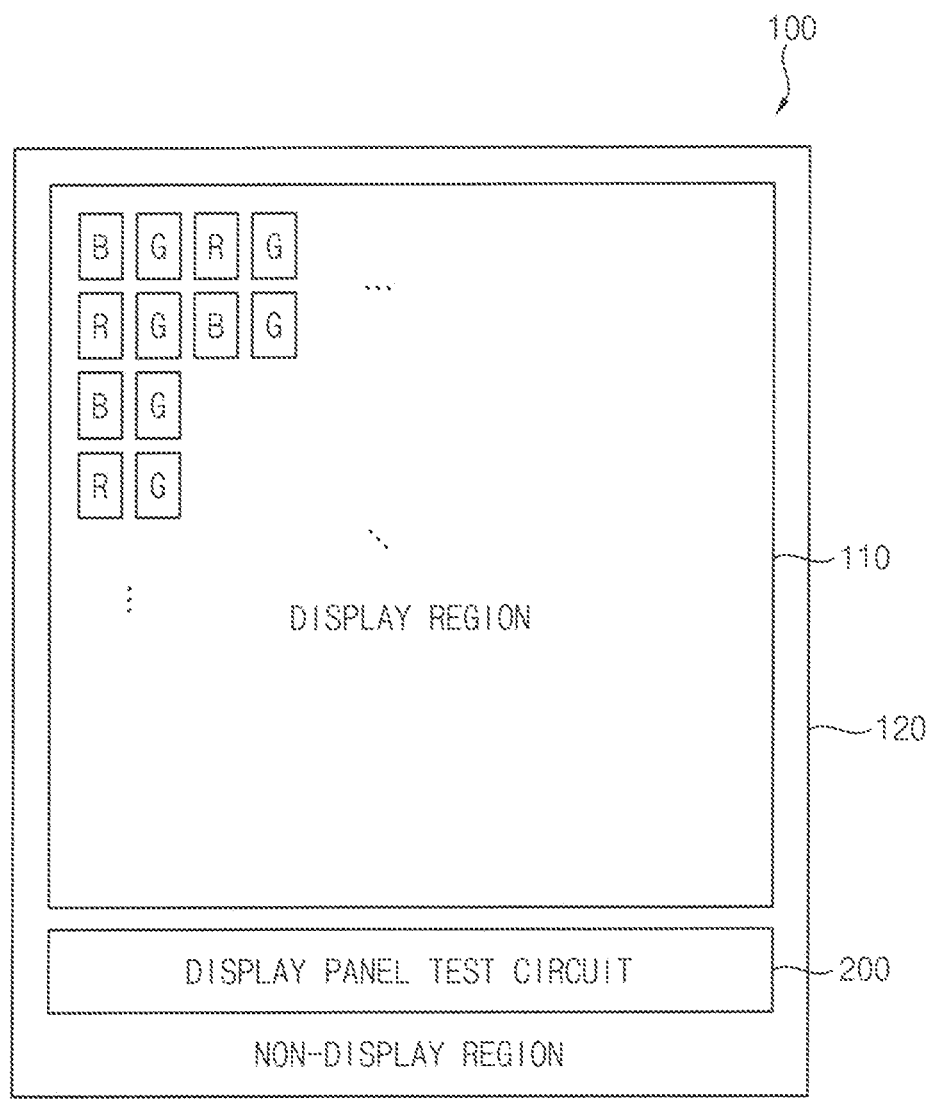
FIG. 1 is a block diagram of a display panel according to an embodiment.

FIG. 1 is a block diagram of a display panel according to an embodiment.

Referring to FIG. 1, a display panel 100 may include a display region 110 and a non-display region 120. The display region 110 may include a plurality of pixels having a pentile structure. For example, as illustrated in FIG. 1, each of the pixels may include one red sub-pixel R, one blue sub-pixel B, and two green sub-pixels G. In the display panel 100, a display panel test circuit 200 that performs one or more tests on the display panel 100 may be provided (or mounted). Examples of the tests that the display panel test circuit 200 performs include, but are not limited to, a pre-lighting test for detecting pixel lighting defects before deposition, a lighting test (for detecting pixel lighting defects after deposition, an open-short test for detecting an open-circuit of data lines and a short-circuit between the data lines, and a crack test for detecting cracks that occur in a region around the display region 110 of the display panel 100. Here, the display panel test circuit 200 may be arranged in the non-display region 120 of the display panel 100 (e.g., a lower region of the display panel 100).

The display panel test circuit 200 may occupy a portion of the non-display region 120 of the display panel 100 although the display panel test circuit 200 may not be used after a display device is manufactured. Due to the space occupied by the display panel test circuit 200, the display device may have a wide bezel. In this case, the space that the display panel test circuit 200 occupies is regarded as a dead space. In one embodiment, the display panel test circuit 200 may have a structure in which at least two test circuits among a pre-lighting test circuit that performs the pre-lighting test on the display panel 100, a lighting test circuit that performs the lighting test on the display panel 100, an open-short test circuit that performs the open-short test on the display panel 100, and a crack test circuit that performs the crack test on the display panel 100 are integrated. Thus, the display panel 100 including the display panel test circuit 200 may have a reduced dead space as compared to a conventional display panel that includes a display panel test circuit having a structure in which the pre-lighting test circuit, the lighting test circuit, the open-short test circuit, and the crack test circuit are individually and independently configured. The display panel test circuit 200 will be described in detail with reference to FIGS. 2 to 7.

Figure 2:
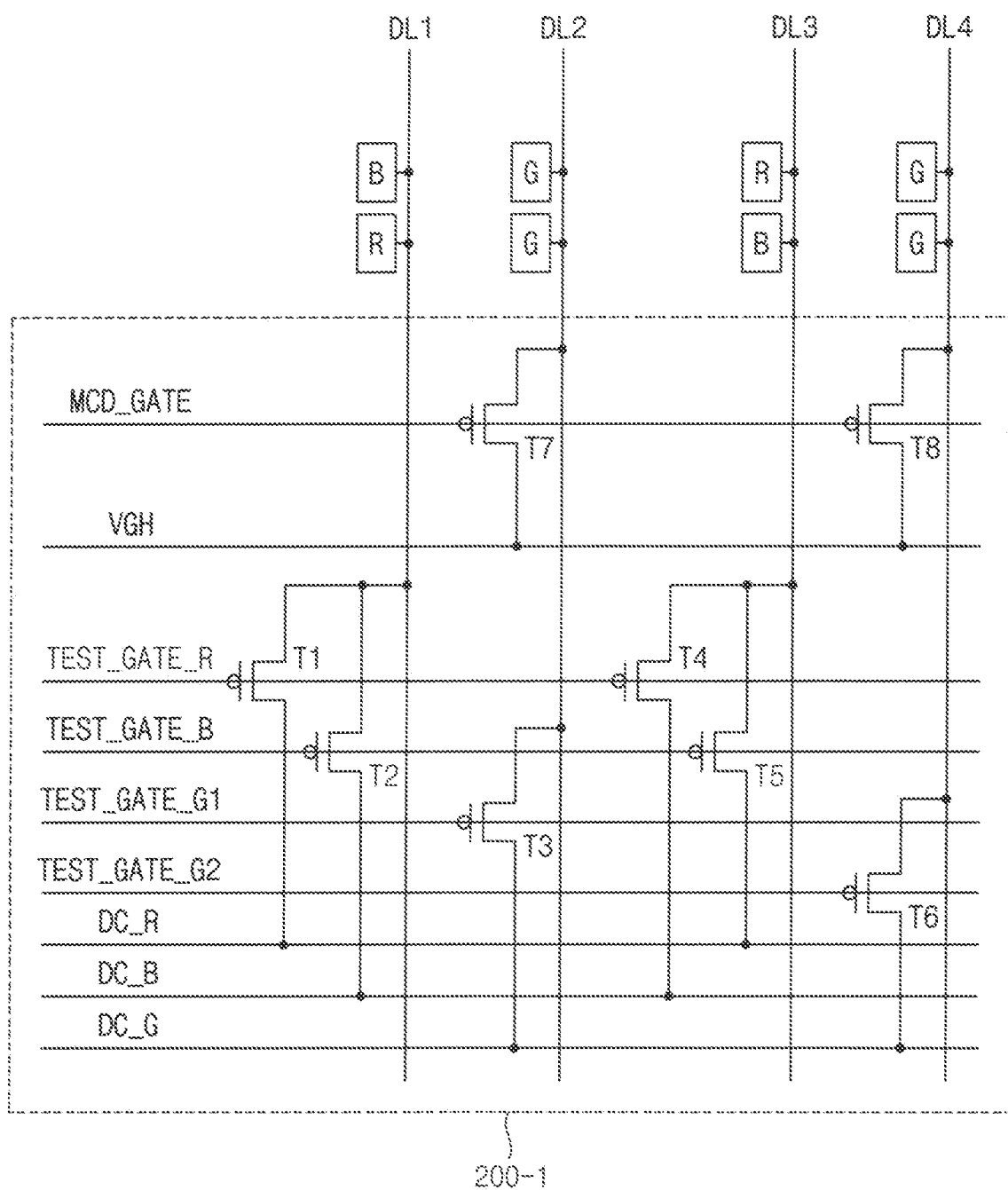
FIG. 2 is a circuit diagram of a display panel test circuit included in the display panel of FIG. 1 according to an embodiment.

FIG. 2 is a circuit diagram of a display panel test circuit included in the display panel 100 of FIG. 1 according to an embodiment, and FIG. 3 is a diagram for describing an operation of the display panel test circuit of FIG. 2.

Referring to FIGS. 2 and 3, a display panel test circuit 200-1 may include a first transistor T1, a second transistor T2, a third transistor T3, a fourth transistor T4, a fifth transistor T5, a sixth transistor T6, a seventh transistor T7, and an eighth transistor T8. The display panel test circuit 200-1 is illustrated with respect to two adjacent pixels connected to one data line among the four adjacent data lines DL1, DL2, DL3, and DL4 in FIG. 2, and it should be understood that the display panel test circuit 200-1 has a structure in which a configuration illustrated in FIG. 2 is repeatedly arranged.

The first transistor T1 may include a first terminal connected to a first data line DL1 to which a first red sub-pixel R and a first blue sub-pixel B are connected, a gate terminal that receives a red lighting test signal TEST_GATE_R, and a second terminal connected to a red lighting voltage line that supplies a red lighting voltage DC_R. The first transistor T1 may transfer the red lighting voltage DC_R to the first data line DL1 when the red lighting test signal TEST_GATE_R has a turn-on voltage level. The second transistor T2 may include a first terminal connected to the first data line DL1 to which the first red sub-pixel R and the first blue sub-pixel B are connected, a gate terminal that receives a blue lighting test signal TEST_GATE_B, and a second terminal connected to a blue lighting voltage line that supplies a blue lighting voltage DC_B. The second transistor T2 may transfer the blue lighting voltage DC_B to the first data line DL1 when the blue lighting test signal TEST_GATE_B has a turn-on voltage level. The third transistor T3 may include a first terminal connected to a second data line DL2 to which first green sub-pixels G are connected, a gate terminal that receives a first green lighting test signal TEST_GATE_G_1, and a second terminal connected to a green lighting voltage line that supplies a green lighting voltage DC_G. The third transistor T3 may transfer the green lighting voltage DC_G to the second data line DL2 when the first green lighting test signal TEST_GATE_G1 has a turn-on voltage level.

The fourth transistor T4 may include a first terminal connected to a third data line DL3 to which a second red sub-pixel R and a second blue sub-pixel B are connected, a gate terminal that receives the red lighting test signal TEST_GATE_R, and a second terminal connected to the blue lighting voltage line that supplies the blue lighting voltage DC_B. The fourth transistor T4 may transfer the blue lighting voltage DC_B to the third data line DL3 when the red lighting test signal TEST_GATE_R has a turn-on voltage level. The fifth transistor T5 may include a first terminal connected to the third data line DL3 to which the second red sub-pixel R and the second blue sub-pixel B are connected, a gate terminal that receives the blue lighting test signal TEST_GATE_B, and a second terminal connected to the red lighting voltage line that supplies the red lighting voltage DC_R. The fifth transistor T5 may transfer the red lighting voltage DC_R to the third data line DL3 when the blue lighting test signal TEST_GATE_B has a turn-on voltage level. The sixth transistor T6 may include a first terminal connected to a fourth data line DL4 to which second green sub-pixels G are connected, a gate terminal that receives a second green lighting test signal TEST_GATE_G2, and a second terminal connected to the green lighting voltage line that transfers the green lighting voltage DC_G. The sixth transistor T6 may transfer the green lighting voltage DC_G to the fourth data line DL4 when the second green lighting test signal TEST_GATE_G2 has a turn-on voltage level.

The seventh transistor T7 may include a first terminal connected to the second data line DL2 to which the first green sub-pixels G are connected, a gate terminal that receives a crack test signal MCD_GATE, and a second terminal connected to a crack detection line VGH. The seventh transistor T7 may transfer a voltage of the crack detection line VGH to the second data line DL2 when the crack test signal MCD_GATE has a turn-on voltage level. The eighth transistor T8 may include a first terminal connected to the fourth data line DL4 to which the second green sub-pixels G are connected, a gate terminal that receives the crack test signal MCD_GATE, and a second terminal connected to the crack detection line VGH. The eighth transistor T8 may transfer the voltage of the crack detection line VGH to the fourth data line DL4 when the crack test signal MCD_GATE has a turn-on voltage level. The crack detection line VGH may pass through the non-display region 120 of the display panel 100. The crack detection line VGH may be connected to the red lighting voltage line, the blue lighting voltage line, or the green lighting voltage line and may be connected to both the seventh transistor T7 and the eighth transistor T8.

In an embodiment, as illustrated in FIG. 3, the display panel test circuit 200-1 may perform a lighting test denoted by DC LIGHTING TEST, an open-short test denoted by OS TEST1 and OS TEST2, and a crack test denoted by MCD TEST on the display panel 100 using the first to eighth transistors T1~T8. The display panel test circuit 200-1 may not include a pre-lighting test circuit for performing a pre-lighting test. Signal levels indicated by X in FIG. 3 denote that the signal levels may be irrelevant for the associated test, and they may have either a turn-on voltage level or a turn-off voltage.

In an embodiment, when the display panel test circuit 200-1 performs the lighting test (i.e., DC LIGHTING TEST) on the display panel 100, the red lighting test signal TEST_GATE_R, the blue lighting test signal TEST_GATE_B, the first green lighting test signal TEST_GATE_G1, and the second green lighting test signal TEST_GATE_G2 may have a turn-on voltage level (e.g., indicated by L), the red lighting voltage DC_R, the blue lighting voltage DC_B, and the green lighting voltage DC_G may have a lighting voltage level (e.g., indicated by L), and the crack test signal MCD_GATE may have a turn-off voltage level (e.g., indicated by H). Thus, the first transistor T1, the second transistor T2, the third transistor T3, the fourth transistor T4, the fifth transistor T5, and the sixth transistor T6 may be turned on, and the seventh transistor T7 and the eighth transistor T8 may be turned off. In one embodiment, the first transistor T1 and the second transistor T2 may be alternately turned on, and the fourth transistor T4 and the fifth transistor T5 may be alternately turned on.

During the lighting test, the first red sub-pixel R and the second red sub-pixel R may emit light because the red lighting voltage DC_R has a lighting voltage level, and the red lighting voltage DC_R is applied to the first red sub-pixel R and the second red sub-pixel R via the first data line DL1 and the third data line DL3, respectively. In addition, the first blue sub-pixel B and the second blue sub-pixel B may emit light because the blue lighting voltage DC_B has a lighting voltage level, and the blue lighting voltage DC_B is applied to the first blue sub-pixel B and the second blue sub-pixel B via the first data line DL1 and the third data line DL3, respectively. Further, the first green sub-pixels G and the second green sub-pixels G may emit light because the green lighting voltage DC_G has a lighting voltage level, and the green lighting voltage DC_G is applied to the first green sub-pixels G and the second green sub-pixels G via the second data line DL2 and the fourth data line DL4, respectively. Thus, the display panel test circuit 200-1 may perform the lighting test (i.e., DC LIGHTING TEST) on the display panel 100 by checking whether the first red sub-pixel R, the first blue sub-pixel B, the first green sub-pixels G, the second red sub-pixel R, the second blue sub-pixel B, and the second green sub-pixels G emit light.

In an embodiment, when the display panel test circuit 200-1 performs a first open-short test (i.e., OS TEST1) on the display panel 100, the red lighting test signal TEST_GATE_R and the second green lighting test signal TEST_GATE_G2 may have a turn-on voltage level (e.g., indicated by L), the first green lighting test signal TEST_GATE_G1 and the blue lighting test signal TEST_GATE_B may have a turn-off voltage level (e.g., indicated by H), the red lighting voltage DC_R may have a non-lighting voltage level (e.g., indicated by H), the blue lighting voltage DC_B and the green lighting voltage DC_G may have a lighting voltage level (e.g., indicated by L), the crack test signal MCD_GATE may have a turn-on voltage level (e.g., indicated by L), and the voltage of the crack detection line VGH may have a non-lighting voltage level (e.g., indicated by H). Thus, the first transistor T1, the fourth transistor T4, the sixth transistor T6, the seventh transistor T7, and the eighth transistor T8 may be turned on, and the second transistor T2, the third transistor T3, and the fifth transistor T5 may be turned off.

During the first open-short test, the first red sub-pixel R and the first blue sub-pixel B that are connected to the first data line DL1 to which the red lighting voltage DC_R is applied via the first transistor T1 may not emit light because the red lighting voltage DC_R that has a non-lighting voltage level, and the second transistor T2 is turned off. In addition, the first green sub-pixels G that are connected to the second data line DL2 to which the voltage of the crack detection line VGH is applied via the seventh transistor T7 may not emit light because the voltage of the crack detection line VGH has a non-lighting voltage level, and the third transistor T3 is turned off. On the other hand, the second green sub-pixels G that are connected to the fourth data line DL4 to which the green lighting voltage DC_G is applied via the sixth transistor T6 may emit light because the green lighting voltage DC_G has a lighting voltage level. Further, the second red sub-pixel R and the second blue sub-pixel B that are connected to the third data line DL3 to which the blue lighting voltage DC_B is applied via the fourth transistor T4 may emit light because the blue lighting voltage DC_B has a lighting voltage level, and the fifth transistor T5 is turned off. Thus, the display panel test circuit 200-1 may perform the first open-short test (i.e., OS TEST1) on the display panel 100 by checking whether the first red sub-pixel R, the first blue sub-pixel B, the first green sub-pixels G, the second red sub-pixel R, the second blue sub-pixel B, and the second green sub-pixels G emit light.

In an embodiment, when the display panel test circuit 200-1 performs a second open-short test (i.e., OS TEST2) on the display panel 100, the red lighting test signal TEST_GATE_R and the first green lighting test signal TEST_GATE_G1 may have a turn-on voltage level (e.g., indicated by L), the second green lighting test signal TEST_GATE_G2 and the blue lighting test signal TEST_GATE_B may have a turn-off voltage level (e.g., indicated by H), the blue lighting voltage DC_B may have a non-lighting voltage level (e.g., indicated by H), the red lighting voltage DC_R and the green lighting voltage DC_G may have a lighting voltage level (e.g., indicated by L), the crack test signal MCD_GATE may have a turn-on voltage level (e.g., indicated by L), and the voltage of the crack detection line VGH may have a non-lighting voltage level (e.g., indicated by H). Thus, the first transistor T1, the third transistor T3, the fourth transistor T4, the seventh transistor T7, and the eighth transistor T8 may be turned on, and the second transistor T2, the fifth transistor T5, and the sixth transistor T6 may be turned off.

During the second open-short test, the first red sub-pixel R and the first blue sub-pixel B that are connected to the first data line DL1 to which the red lighting voltage DC_R is applied via the first transistor T1 may emit light because the red lighting voltage DC_R has a lighting voltage level. In addition, the first green sub-pixels G that are connected to the second data line DL2 to which the green lighting voltage DC_G is applied via the third transistor T3 may emit light because the green lighting voltage DC_G has a lighting voltage level. On the other hand, the second red sub-pixel R and the second blue sub-pixel B connected to the third data line DL3 to which the blue lighting voltage DC_B is applied via the fourth transistor T4 may not emit light because the blue lighting voltage DC_B has a non-lighting voltage level, and the fifth transistor T5 is turned off. Further, the second green sub-pixels G that are connected to the fourth data line DL4 to which the voltage of the crack detection line VGH is applied via the eighth transistor T8 may not emit light because the voltage of the crack detection line VGH has a non-lighting voltage level, and the sixth transistor T6 is turned off. Thus, the display panel test circuit 200-1 may perform the second open-short test (i.e., OS TEST2) on the display panel 100 by checking whether the first red sub-pixel R, the first blue sub-pixel B, the first green sub-pixels G, the second red sub-pixel R, the second blue sub-pixel B, and the second green sub-pixels G emit light.

In an embodiment, when the display panel test circuit 200-1 performs a crack test (i.e., MCD TEST) on the display panel 100, one of the red lighting test signal TEST_GATE_R and the blue lighting test signal TEST_GATE_B may have a turn-on voltage level (e.g., indicated by L), another of the red lighting test signal TEST_GATE_R and the blue lighting test signal TEST_GATE_B may have a turn-off voltage level (e.g., indicated by H), the first green lighting test signal TEST_GATE_G1 and the second green lighting test signal TEST_GATE_G2 may have a turn-off voltage level (e.g., indicated by H), the red lighting voltage DC_R, the blue lighting voltage DC_B, and the green lighting voltage DC_G may have a non-lighting voltage level (e.g., indicated by H), the crack test signal MCD_GATE may have a turn-on voltage level (e.g., indicated by L), and the voltage of the crack detection line VGH may have a non-lighting voltage level (e.g., indicated by H). Thus, the first transistor T1, the second transistor T2, the third transistor T3, the fourth transistor T4, the fifth transistor T5, and the sixth transistor T6 may be turned off, and the seventh transistor T7 and the eighth transistor T8 may be turned on. As described above, the crack detection line VGH may pass through the non-display region 120 of the display panel 100, and the crack detection line VGH may be connected to the red lighting voltage line, the blue lighting voltage line, or the green lighting voltage line and may be connected to both the seventh transistor T7 and the eighth transistor T8. Thus, when the seventh transistor T7 and the eighth transistor T8 are turned on while a voltage having a non-lighting voltage level is applied to the crack detection line VGH, the first green sub-pixels G connected to the second data line DL2 and the second green sub-pixels G connected to the fourth data line DL4 may not emit light. Thus, if the first green sub-pixels G connected to the second data line DL2 and/or the second green sub-pixels G connected to the fourth data line DL4 emit light as the seventh transistor T7 and the eighth transistor T8 are turned on while a voltage having a non-lighting voltage level is applied to the crack detection line VGH, it may be determined that a crack may have occurred in the non-display region 120 of the display panel 100. In this way, the display panel test circuit 200-1 may perform the crack test (i.e., MCD TEST) on the display panel 100.

The display panel test circuit 200-1 may have a structure in which at least two test circuits among the lighting test circuit that performs the lighting test (i.e., DC LIGHTING TEST) on the display panel 100, the open-short test circuit that performs the open-short test (i.e., OS TEST1 and OS TEST2) on the display panel 100, and the crack test circuit that performs the crack test (i.e., MCD TEST) on the display panel 100 are integrated. Thus, the display panel 100 including the display panel test circuit 200-1 may have a reduced dead space as compared to a conventional display panel that includes a display panel test circuit having a structure in which the lighting test circuit, the open-short test circuit, and the crack test circuit are individually and independently configured. In other words, the display panel test circuit 200-1 may perform the lighting test (i.e., DC LIGHTING TEST), the open-short test (i.e., OS TEST1 and OS TEST2), and the crack test (i.e., MCD TEST) on the display panel 100 based on the structure in which the lighting test circuit, the open-short test circuit, and the crack test circuit are integrated. The display panel test circuit 200-1 may have a reduced number of transistors as compared to the conventional display panel test circuit having the structure in which the lighting test circuit, the open-short test circuit, and the crack test circuit are individually and independently configured, and thus may reduce the dead space of the display panel 100. Although it is illustrated in FIG. 2 that the first to eighth transistors T1~T8 are implemented by p-channel metal oxide semiconductor (PMOS) transistors, the present disclosure is not limited thereto. For example, the first to eighth transistors T1~T8 may be implemented by n-channel metal oxide semiconductor (NMOS) transistors. For example, a portion of the first to eighth transistors T1~T8 may be implemented by PMOS transistors, and the rest of the first to eighth transistors T1~T8 may be implemented by NMOS transistors. It is understood that the voltage level applied to the gate terminals of the first to eighth transistors T1~T8 may be correspondingly changed depending on the type (e.g., PMOS or NMOS) of the first to eighth transistors T1~T8.

Figure 4:
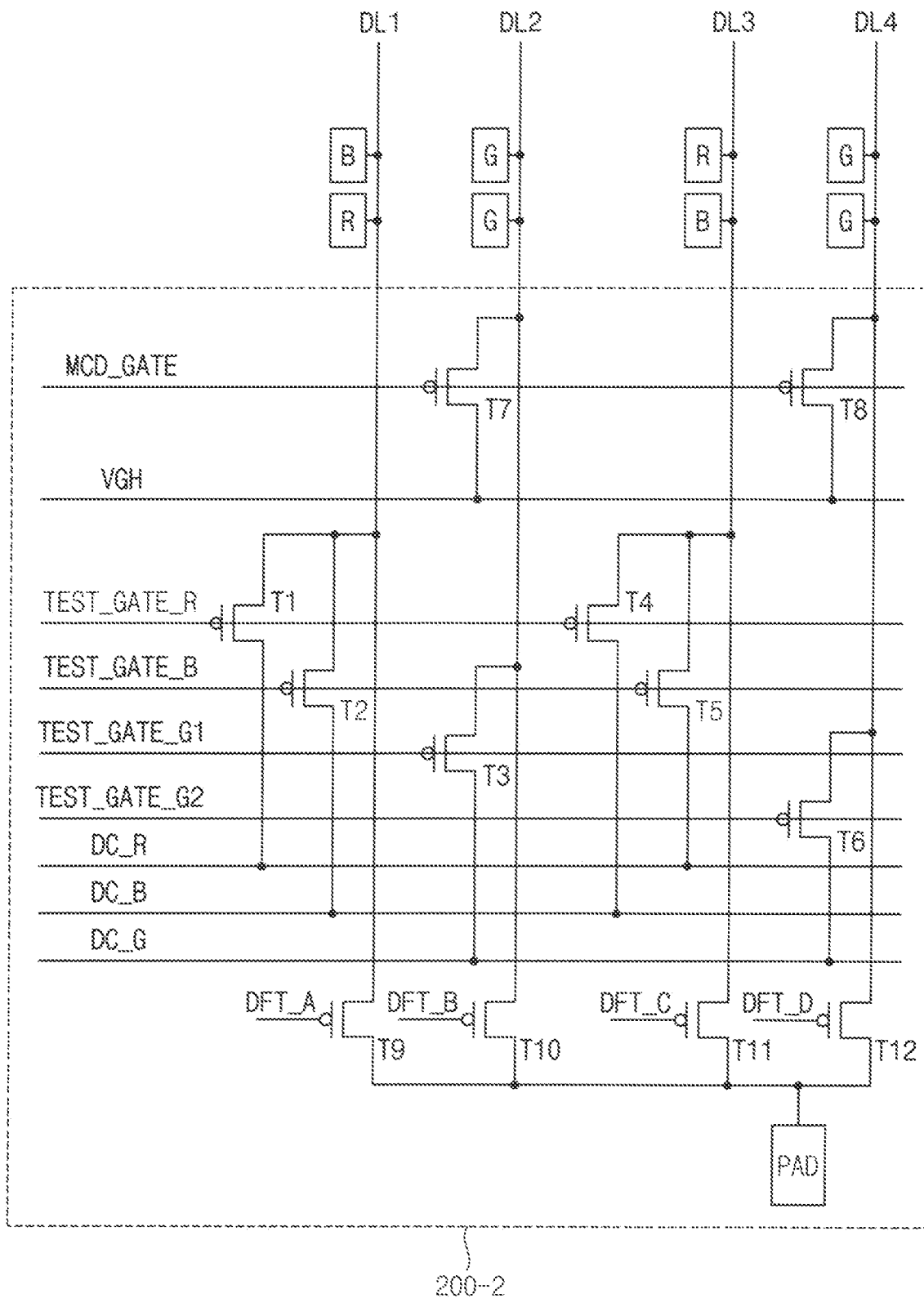
FIG. 4 is a circuit diagram of a display panel test circuit included in the display panel of FIG. 1 according to another embodiment.

FIG. 4 is a circuit diagram of a display panel test circuit included in the display panel 100 of FIG. 1 according to another embodiment.

Referring to FIG. 4, a display panel test circuit 200-2 may include the first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, and a twelfth transistor T12. The display panel test circuit 200-2 may include a component corresponding to a pre-lighting test circuit for performing a pre-lighting test (i.e., the ninth to twelfth transistors T9~T12) that is added to the display panel test circuit 200-1 of FIG. 2. Thus, in describing the display panel test circuit 200-2, duplicated description with the display panel test circuit 200-1 of FIG. 2 will not be repeated, and only the component corresponding to the pre-lighting test circuit for performing the pre-lighting test (i.e., the ninth to twelfth transistors T9~T12) will be described below. The display panel test circuit 200-2 is illustrated with respect to two adjacent pixels connected to one data line among the four adjacent data lines DL1, DL2, DL3, and DL4 in FIG. 4, and it should be understood that the display panel test circuit 200-2 has a structure in which a configuration illustrated in FIG. 4 is repeatedly arranged.

The ninth transistor T9 may include a first terminal connected to a first data line DL1 to which a first red sub-pixel R and a first blue sub-pixel B are connected, a gate terminal that receives a first pre-lighting test signal DFT_A, and a second terminal connected to a pre-lighting test pad PAD. When the first pre-lighting test signal DFT_A has a turn-on voltage level, the ninth transistor T9 may transfer a pre-lighting voltage having a lighting voltage level that is applied via the pre-lighting test pad PAD to the first data line DL1. The tenth transistor T10 may include a first terminal connected to a second data line DL2 to which first green sub-pixels G are connected, a gate terminal that receives a second pre-lighting test signal DFT_B, and a second terminal connected to the pre-lighting test pad PAD. When the second pre-lighting test signal DFT_B has a turn-on voltage level, the tenth transistor T10 may transfer the pre-lighting voltage having the lighting voltage level that is applied via the pre-lighting test pad PAD to the second data line DL2. The eleventh transistor T11 may include a first terminal connected to a third data line DL3 to which a second red sub-pixel R and a second blue sub-pixel B are connected, a gate terminal that receives a third pre-lighting test signal DFT_C, and a second terminal connected to the pre-lighting test pad PAD. When the third pre-lighting test signal DFT_C has a turn-on voltage level, the eleventh transistor T11 may transfer the pre-lighting voltage having the lighting voltage level, that is applied via the pre-lighting test pad PAD to the third data line DL3. The twelfth transistor T12 may include a first terminal connected to a fourth data line DL4 to which second green sub-pixels G are connected, a gate terminal that receives a fourth pre-lighting test signal DFT_D, and a second terminal connected to the pre-lighting test pad PAD. When the fourth pre-lighting test signal DFT_D has a turn-on voltage level, the twelfth transistor T12 may transfer the pre-lighting voltage having the lighting voltage level that is applied via the pre-lighting test pad PAD to the fourth data line DL4.

In an embodiment, when the display panel test circuit 200-2 performs a pre-lighting test denoted by DFT TEST on the display panel 100, a red lighting test signal TEST_GATE_R, a blue lighting test signal TEST_GATE_B, a first green lighting test signal TEST_GATE_G1, and a second green lighting test signal TEST_GATE_G2 may have a turn-off voltage level (e.g., indicated by H), a crack test signal MCD_GATE may have a turn-off voltage level (e.g., indicated by H), the first pre-lighting test signal DFT_A, the second pre-lighting test signal DFT_B, the third pre-lighting test signal DFT_C, and the fourth pre-lighting test signal DFT_D may have a turn-on voltage level (e.g., indicated by L), and the pre-lighting voltage having the lighting voltage level may be applied via the pre-lighting test pad PAD. Thus, the first transistor T1, the second transistor T2, the third transistor T3, the fourth transistor T4, the fifth transistor T5, the sixth transistor T6, the seventh transistor T7, and the eighth transistor T8 may be turned off, and the ninth transistor T9, the tenth transistor T10, the eleventh transistor T11, and the twelfth transistor T12 may be turned on. Because the pre-lighting voltage having the lighting voltage level is applied via the pre-lighting test pad PAD, and the ninth to twelfth transistors T9~T12 are turned on, the pre-lighting voltage having the lighting voltage level may be applied to the first red sub-pixel R, the first green sub-pixels G, the first blue sub-pixel B, the second red sub-pixel R, the second green sub-pixels G, and the second blue sub-pixel B via the first data line DL1, the second data line DL2, the third data line DL3, and the fourth data line DL4, respectively. Accordingly, the first red sub-pixel R, the first green sub-pixels G, the first blue sub-pixel B, the second red sub-pixel R, the second green sub-pixels G, and the second blue sub-pixel B may emit light. Thus, the display panel test circuit 200-2 may perform the pre-lighting test (i.e., DFT TEST) on the display panel 100 by checking whether the first red sub-pixel R, the first green sub-pixels G, the first blue sub-pixel B, the second red sub-pixel R, the second green sub-pixels G, and the second blue sub-pixel B emit light by applying the pre-lighting voltage having the lighting voltage level via the pre-lighting test pad PAD.

The display panel test circuit 200-2 may have a structure in which at least two test circuits among the pre-lighting test circuit that performs the pre-lighting test (i.e., DFT TEST) on the display panel 100, the lighting test circuit that performs the lighting test (i.e., DC LIGHTING TEST) on the display panel 100, the open-short test circuit that performs the open-short test (i.e., OS TEST1 and OS TEST2) on the display panel 100, and the crack test circuit that performs the crack test (i.e., MCD TEST) on the display panel 100 are integrated. Thus, the display panel 100 including the display panel test circuit 200-2 may have a reduced dead space as compared to a conventional display panel that includes a display panel test circuit having a structure in which the pre-lighting test circuit, the lighting test circuit, the open-short test circuit, and the crack test circuit are individually and independently configured. In other words, the display panel test circuit 200-2 may perform the pre-lighting test (i.e., DFT TEST), the lighting test (i.e., DC LIGHTING TEST), the open-short test (i.e., OS TEST1 and OS TEST2), and the crack test (i.e., MCD TEST) on the display panel 100 based on the structure in which the pre-lighting test circuit, the lighting test circuit, the open-short test circuit, and the crack test circuit are integrated. The display panel test circuit 200-2 may have a reduced number of transistors as compared to the conventional display panel test circuit having the structure in which the pre-lighting test circuit, the lighting test circuit, the open-short test circuit, and the crack test circuit are individually and independently configured, and thus may reduce the dead space of the display panel 100. Although it is illustrated in FIG. 4 that the first to twelfth transistors T1~T12 are implemented by PMOS transistors, the present disclosure is not limited thereto. For example, the first to twelfth transistors T1~T12 may be implemented by NMOS transistors. For example, a portion of the first to twelfth transistors T1~T12 may be implemented by PMOS transistors, and the rest of the first to twelfth transistors T1~T12 may be implemented by NMOS transistors. It is understood that the voltage level applied to the gate terminals of the first to twelfth transistors T1~T12 may be correspondingly changed depending on the type (e.g., PMOS or NMOS) of the first to twelfth transistors T1~T12.

Figure 5:
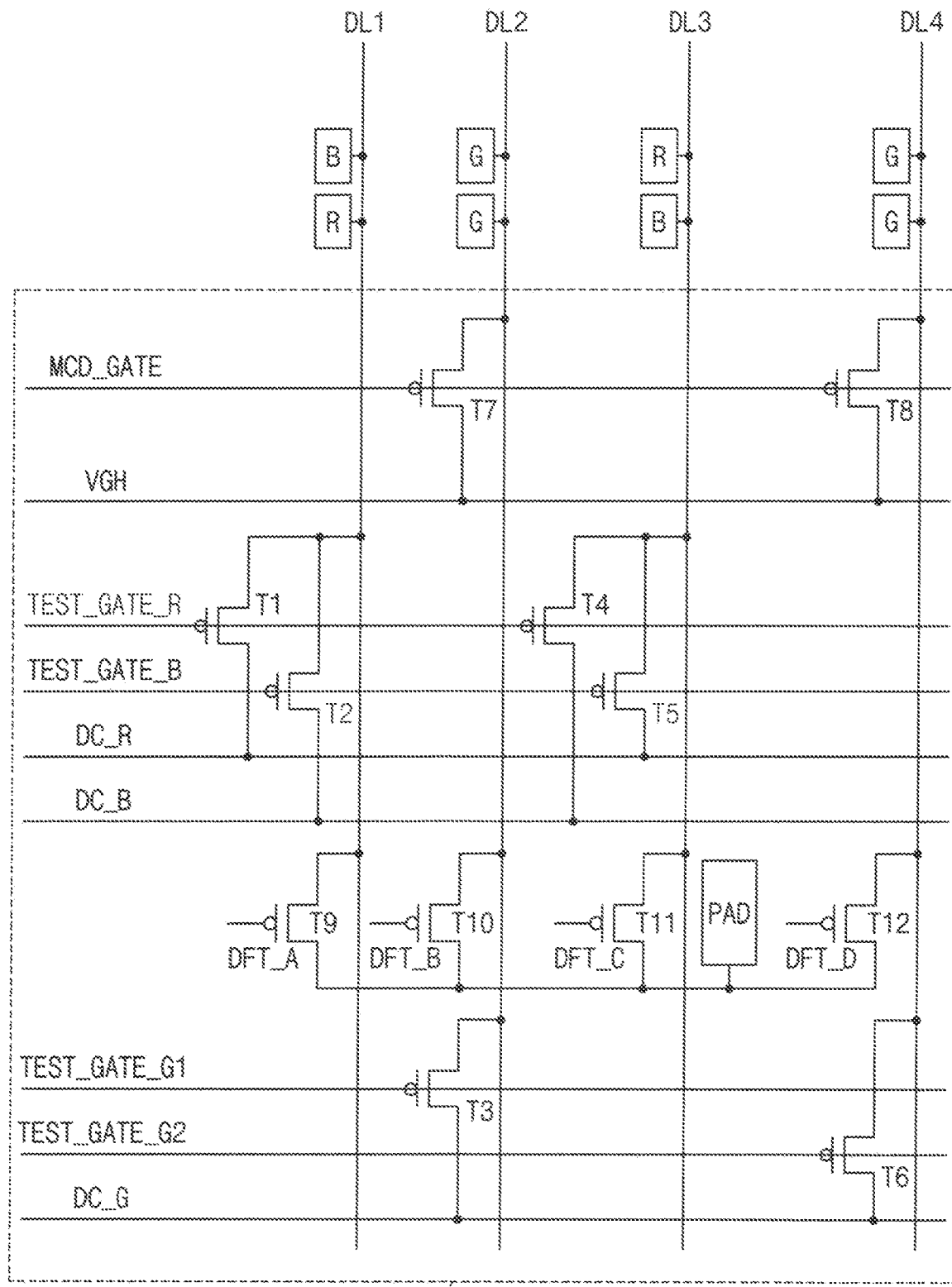
FIG. 5 is a circuit diagram of a display panel test circuit included in the display panel of FIG. 1 according to yet another embodiment.

FIG. 5 is a circuit diagram of a display panel test circuit included in the display panel 100 of FIG. 1 according to yet another embodiment.

Referring to FIG. 5, a display panel test circuit 200-3 may include a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, and a twelfth transistor T12. That is, except that the ninth transistor T9, the tenth transistor T10, the eleventh transistor T11, and the twelfth transistor T12 are arranged between a green lighting voltage line DC_G and a blue lighting voltage line DC_B or a red lighting voltage line DC_R, the display panel test circuit 200-3 may be substantially the same as the display panel test circuit 200-2 of FIG. 4. Thus, duplicated description of the first to twelfth transistors T1~T12 included in the display panel test circuit 200-3 will not be repeated. The display panel test circuit 200-3 is illustrated with respect to two adjacent pixels connected to one data line among the four adjacent data lines DL1, DL2, DL3, and DL4 in FIG. 5, and it should be understood that the display panel test circuit 200-3 has a structure in which a configuration illustrated in FIG. 5 is repeatedly arranged. In addition, although it is illustrated in FIG. 5 that the ninth transistor T9, the tenth transistor T10, the eleventh transistor T11, and the twelfth transistor T12 are arranged between the green lighting voltage line DC_G and the blue lighting voltage line DC_B, the present disclosure is not limited thereto. For example, the ninth transistor T9, the tenth transistor T10, the eleventh transistor T11, and the twelfth transistor T12 may be arranged between the red lighting voltage line DC_R and the blue lighting voltage line DC_B or between the crack detection line VGH and the blue lighting voltage line DC_B.

Figure 6:
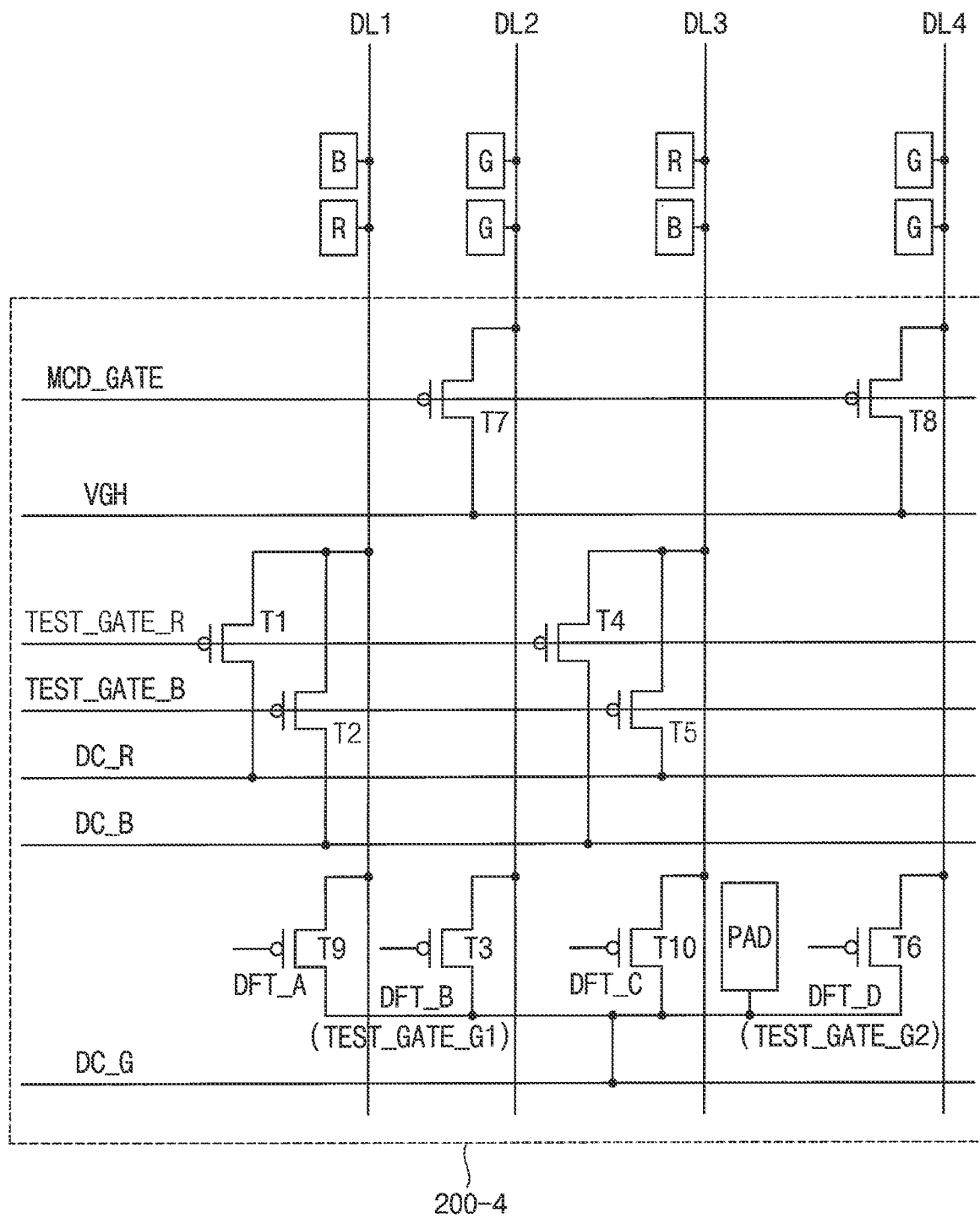
FIG. 6 is a circuit diagram of a display panel test circuit included in the display panel of FIG. 1 according to yet another embodiment.

FIG. 6 is a circuit diagram of a display panel test circuit included in the display panel 100 of FIG. 1 according to yet another embodiment.

Referring to FIG. 6, a display panel test circuit 200-4 may include a first transistor T1, a second transistor T2, a third transistor T3, a fourth transistor T4, a fifth transistor T5, a sixth transistor T6, a seventh transistor T7, an eighth transistor T8, a ninth transistor T9, and a tenth transistor T10. The display panel test circuit 200-4 is illustrated with respect to two adjacent pixels connected to one data line among the four adjacent data lines DL1, DL2, DL3, and DL4 in FIG. 6, and it should be understood that the display panel test circuit 200-4 has a structure in which a configuration illustrated in FIG. 6 is repeatedly arranged.

The first transistor T1 may include a first terminal connected to a first data line DL1 to which a first red sub-pixel R and a first blue sub-pixel B are connected, a gate terminal that receives a red lighting test signal TEST_GATE_R, and a second terminal connected to a red lighting voltage line that supplies a red lighting voltage DC_R. Thus, the first transistor T1 may transfer the red lighting voltage DC_R to the first data line DL1 when the red lighting test signal TEST_GATE_R has a turn-on voltage level. The second transistor T2 may include a first terminal connected to the first data line DL1 to which the first red sub-pixel R and the first blue sub-pixel B are connected, a gate terminal that receives a blue lighting test signal TEST_GATE_B, and a second terminal connected to a blue lighting voltage line that supplies a blue lighting voltage DC_B. The second transistor T2 may transfer the blue lighting voltage DC_B to the first data line DL1 when the blue lighting test signal TEST_GATE_B has a turn-on voltage level. The third transistor T3 may include a first terminal connected to a second data line DL2 to which first green sub-pixels G are connected, a gate terminal that receives a first green lighting test signal TEST_GATE_G1 (i.e., DFT_B), and a second terminal connected to both a pre-lighting test pad PAD and a green lighting voltage line that supplies a green lighting voltage DC_G. Thus, the third transistor T3 may transfer the green lighting voltage DC_G or a pre-lighting voltage having a lighting voltage level that is applied via the pre-lighting test pad PAD to the second data line DL2 when the first green lighting test signal TEST_GATE_G1 (i.e., DFT_B) has a turn-on voltage level.

The fourth transistor T4 may include a first terminal connected to a third data line DL3 to which a second red sub-pixel R and a second blue sub-pixel B are connected, a gate terminal that receives the red lighting test signal TEST_GATE_R, and a second terminal connected to the blue lighting voltage line that supplies the blue lighting voltage DC_B. The fourth transistor T4 may transfer the blue lighting voltage DC_B to the third data line DL3 when the red lighting test signal TEST_GATE_R has a turn-on voltage level. The fifth transistor T5 may include a first terminal connected to the third data line DL3 to which the second red sub-pixel R and the second blue sub-pixel B are connected, a gate terminal that receives the blue lighting test signal TEST_GATE_B, and a second terminal connected to the red lighting voltage line that supplies the red lighting voltage DC_R. The fifth transistor T5 may transfer the red lighting voltage DC_R to the third data line DL3 when the blue lighting test signal TEST_GATE_B has a turn-on voltage level. The sixth transistor T6 may include a first terminal connected to a fourth data line DL4 to which second green sub-pixels G are connected, a gate terminal that receives a second green lighting test signal TEST_GATE_G2 (i.e., DFT_D), and a second terminal connected to both the pre-lighting test pad PAD and the green lighting voltage line that transfers the green lighting voltage DC_G. Thus, the sixth transistor T6 may transfer the green lighting voltage DC_G or the pre-lighting voltage having the lighting voltage level that is applied via the pre-lighting test pad PAD to the fourth data line DL4 when the second green lighting test signal TEST_GATE_G2 (i.e., DFT_D) has a turn-on voltage level.

The seventh transistor T7 may include a first terminal connected to the second data line DL2 to which the first green sub-pixels G are connected, a gate terminal that receives a crack test signal MCD_GATE, and a second terminal connected to a crack detection line VGH. The seventh transistor T7 may transfer a voltage of the crack detection line VGH to the second data line DL2 when the crack test signal MCD_GATE has a turn-on voltage level. The eighth transistor T8 may include a first terminal connected to the fourth data line DL4 to which the second green sub-pixels G are connected, a gate terminal that receives the crack test signal MCD_GATE, and a second terminal connected to the crack detection line VGH. The eighth transistor T8 may transfer the voltage of the crack detection line VGH to the fourth data line DL4 when the crack test signal MCD_GATE has a turn-on voltage level. The crack detection line VGH may pass through the non-display region 120 of the display panel 100. The crack detection line VGH may be connected to the red lighting voltage line, the blue lighting voltage line, or the green lighting voltage line and may be connected to both the seventh transistor T7 and the eighth transistor T8.

The ninth transistor T9 may include a first terminal connected to the first data line DL1 to which the first red sub-pixel R and the first blue sub-pixel B are connected, a gate terminal that receives a first pre-lighting test signal DFT_A, and a second terminal connected to both the pre-lighting test pad PAD and the green lighting voltage line that supplies the green lighting voltage DC_G. Thus, when the first pre-lighting test signal DFT_A has a turn-on voltage level, the ninth transistor T9 may transfer the green lighting voltage DC_G or the pre-lighting voltage having the lighting voltage level that is applied via the pre-lighting test pad PAD to the first data line DL1. The tenth transistor T10 may include a first terminal connected to the third data line DL3 to which the second red sub-pixel R and the second blue sub-pixel B are connected, a gate terminal that receives a third pre-lighting test signal DFT_C, and a second terminal connected to both the pre-lighting test pad PAD and the green lighting voltage line that supplies the green lighting voltage DC_G. Thus, when the third pre-lighting test signal DFT_C has a turn-on voltage level, the tenth transistor T10 may transfer the green lighting voltage DC_G or the pre-lighting voltage having the lighting voltage level that is applied via the pre-lighting test pad PAD to the fourth data line DL4. In the embodiment illustrated in FIG. 6, the display panel test circuit 200-4 may perform the lighting test, the open-short test, and the crack test on the display panel 100 using the first to tenth transistors T1~T10.

In an embodiment, when the display panel test circuit 200-4 performs the lighting test (i.e., DC LIGHTING TEST) on the display panel 100, the red lighting test signal TEST_GATE_R, the blue lighting test signal TEST_GATE_B, the first green lighting test signal TEST_GATE_G1 (i.e., DFT_B), and the second green lighting test signal TEST_GATE_G2 (i.e., DFT_D) may have a turn-on voltage level, the red lighting voltage DC_R, the blue lighting voltage DC_B, and the green lighting voltage DC_G may have a lighting voltage level, the crack test signal MCD_GATE may have a turn-off voltage level, and the first pre-lighting test signal DFT_A and the third pre-lighting test signal DFT_C may have a turn-off voltage level. Thus, the first transistor T1, the second transistor T2, the third transistor T3, the fourth transistor T4, the fifth transistor T5, and the sixth transistor T6 may be turned on (e.g., the first transistor T1 and the second transistor T2 may be alternately turned on, and the fourth transistor T4 and the fifth transistor T5 may be alternately turned on), and the seventh transistor T7, the eighth transistor T8, the ninth transistor T9, and the tenth transistor T10 may be turned off.

During the lighting test, the first red sub-pixel R and the second red sub-pixel R may emit light because the red lighting voltage DC_R has a lighting voltage level and the red lighting voltage DC_R is applied to the first red sub-pixel R and the second red sub-pixel R via the first data line DL1 and the third data line DL3, respectively. In addition, the first blue sub-pixel B and the second blue sub-pixel B may emit light because the blue lighting voltage DC_B has a lighting voltage level and the blue lighting voltage DC_B is applied to the first blue sub-pixel B and the second blue sub-pixel B via the first data line DL1 and the third data line DL3, respectively. Further, the first green sub-pixels G and the second green sub-pixels G may emit light because the green lighting voltage DC_G has a lighting voltage level and the green lighting voltage DC_G is applied to the first green sub-pixels G and the second green sub-pixels G via the second data line DL2 and the fourth data line DL4. Thus, the display panel test circuit 200-4 may perform the lighting test on the display panel 100 by checking whether the first red sub-pixel R, the first blue sub-pixel B, the first green sub-pixels G, the second red sub-pixel R, the second blue sub-pixel B, and the second green sub-pixels G emit light.

In an embodiment, when the display panel test circuit 200-4 performs a first open-short test (i.e., OS TEST1) on the display panel 100, the red lighting test signal TEST_GATE_R and the second green lighting test signal TEST_GATE_G2 (i.e., DFT_D) may have a turn-on voltage level, the first green lighting test signal TEST_GATE_G1 (i.e., DFT_B) and the blue lighting test signal TEST_GATE_B may have a turn-off voltage level, the red lighting voltage DC_R may have a non-lighting voltage level, the blue lighting voltage DC_B and the green lighting voltage DC_G may have a lighting voltage level, the crack test signal MCD_GATE may have a turn-on voltage level, the first pre-lighting test signal DFT_A and the third pre-lighting test signal DFT_C may have a turn-off voltage level, and the voltage of the crack detection line VGH may have a non-lighting voltage level. Thus, the first transistor T1, the fourth transistor T4, the sixth transistor T6, the seventh transistor T7, and the eighth transistor T8 may be turned on, and the second transistor T2, the third transistor T3, the fifth transistor T5, the ninth transistor T9, and the tenth transistor T10 may be turned off.

During the first open-short test, the first red sub-pixel R and the first blue sub-pixel B that are connected to the first data line DL1 to which the red lighting voltage DC_R is applied via the first transistor T1 may not emit light because the red lighting voltage DC_R has a non-lighting voltage level, and the second transistor T2 is turned off. In addition, the first green sub-pixels G that are connected to the second data line DL2 to which the voltage of the crack detection line VGH is applied via the seventh transistor T7 may not emit light because the voltage of the crack detection line VGH has a non-lighting voltage level, and the third transistor T3 is turned off. On the other hand, the second green sub-pixels G that are connected to the fourth data line DL4 to which the green lighting voltage DC_G is applied via the sixth transistor T6 may emit light because the green lighting voltage DC_G has a lighting voltage level. Further, the second red sub-pixel R and the second blue sub-pixel B that are connected to the third data line DL3 to which the blue lighting voltage DC_B is applied via the fourth transistor T4 may emit light because the blue lighting voltage DC_B has a lighting voltage level. Thus, the display panel test circuit 200-4 may perform the first open-short test on the display panel 100 by checking whether the first red sub-pixel R, the first blue sub-pixel B, the first green sub-pixels G, the second red sub-pixel R, the second blue sub-pixel B, and the second green sub-pixels G emit light.

In an embodiment, when the display panel test circuit 200-4 performs a second open-short test (i.e., OS TEST2) on the display panel 100, the red lighting test signal TEST_GATE_R and the first green lighting test signal TEST_GATE_G1 (i.e., DFT_B) may have a turn-on voltage level, the second green lighting test signal TEST_GATE_G2 (i.e., DFT_D) and the blue lighting test signal TEST_GATE_B may have a turn-off voltage level, the blue lighting voltage DC_B may have a non-lighting voltage level, the red lighting voltage DC_R and the green lighting voltage DC_G may have a lighting voltage level, the crack test signal MCD_GATE may have a turn-on voltage level, the first pre-lighting test signal DFT_A and the third pre-lighting test signal DFT_C may have a turn-off voltage level, and the voltage of the crack detection line VGH may have a non-lighting voltage level. Thus, the first transistor T1, the third transistor T3, the fourth transistor T4, the seventh transistor T7, and the eighth transistor T8 may be turned on, and the second transistor T2, the fifth transistor T5, the sixth transistor T6, the ninth transistor T9, and the tenth transistor T10 may be turned off.

During the second open-short test, the first red sub-pixel R and the first blue sub-pixel B that are connected to the first data line DL1 to which the red lighting voltage DC_R is applied via the first transistor T1 may emit light because the red lighting voltage DC_R has a lighting voltage level. In addition, the first green sub-pixels G that are connected to the second data line DL2 to which the green lighting voltage DC_G is applied via the third transistor T3 may emit light because the green lighting voltage DC_G has a lighting voltage level. On the other hand, the second red sub-pixel R and the second blue sub-pixel B connected to the third data line DL3 to which the blue lighting voltage DC_B is applied via the fourth transistor T4 may not emit light because the blue lighting voltage DC_B has a non-lighting voltage level, and the fifth transistor T5 is turned off. Further, the second green sub-pixels G that are connected to the fourth data line DL4 to which the voltage of the crack detection line VGH is applied via the eighth transistor T8 may not emit light because the voltage of the crack detection line VGH has a non-lighting voltage level, and the sixth transistor T6 is turned off. Thus, the display panel test circuit 200-4 may perform the second open-short test on the display panel 100 by checking whether the first red sub-pixel R, the first blue sub-pixel B, the first green sub-pixels G, the second red sub-pixel R, the second blue sub-pixel B, and the second green sub-pixels G emit light.

In an embodiment, when the display panel test circuit 200-4 performs a crack test (i.e., MCD TEST) on the display panel 100, one of the red lighting test signal TEST_GATE_R and the blue lighting test signal TEST_GATE_B may have a turn-on voltage level, another of the red lighting test signal TEST_GATE_R and the blue lighting test signal TEST_GATE_B may have a turn-off voltage level, the first green lighting test signal TEST_GATE_G1 (i.e., DFT_B) and the second green lighting test signal TEST_GATE_G2 (i.e., DFT_D) may have a turn-off voltage level, the red lighting voltage DC_R, the blue lighting voltage DC_B, and the green lighting voltage DC_G may have a non-lighting voltage level, the crack test signal MCD_GATE may have a turn-on voltage level, the first pre-lighting test signal DFT_A and the third pre-lighting test signal DFT_C may have a turn-off voltage level, and the voltage of the crack detection line VGH may have a non-lighting voltage level. Thus, the first transistor T1, the second transistor T2, the third transistor T3, the fourth transistor T4, the fifth transistor T5, the sixth transistor T6, the ninth transistor T9, and the tenth transistor T10 may be turned off, and the seventh transistor T7 and the eighth transistor T8 may be turned on. As described above, the crack detection line VGH may pass through the non-display region 120 of the display panel 100, and the crack detection line VGH may be connected to the red lighting voltage line, the blue lighting voltage line, or the green lighting voltage line and may be connected to both the seventh transistor T7 and the eighth transistor T8. Thus, when the seventh transistor T7 and the eighth transistor T8 are turned on while a voltage having a non-lighting voltage level is applied to the crack detection line VGH, the first green sub-pixels G connected to the second data line DL2 and the second green sub-pixels G connected to the fourth data line DL4 may not emit light. Thus, if the first green sub-pixels G connected to the second data line DL2 and/or the second green sub-pixels G connected to the fourth data line DL4 emit light as the seventh transistor T7 and the eighth transistor T8 are turned on while a voltage having a non-lighting voltage level is applied to the crack detection line VGH, it may be determined that a crack may have occurred in the non-display region 120 of the display panel 100. In this way, the display panel test circuit 200-4 may perform the crack test on the display panel 100.

In an embodiment, when the display panel test circuit 200-4 performs a pre-lighting test on the display panel 100, the red lighting test signal TEST_GATE_R and the blue lighting test signal TEST_GATE_B may have a turn-off voltage level, the crack test signal MCD_GATE may have a turn-off voltage level, the first pre-lighting test signal DFT_A, the third pre-lighting test signal DFT_C, the first green lighting test signal TEST_GATE_G1 (i.e., DFT_B), and the second green lighting test signal TEST_GATE_G2 (i.e., DFT_D) may have a turn-off voltage level, and the pre-lighting voltage having the lighting voltage level may be applied via the pre-lighting test pad PAD. Thus, the first transistor T1, the second transistor T2, the fourth transistor T4, the fifth transistor T5, the seventh transistor T7, and the eighth transistor T8 may be turned off, and the third transistor T3, the sixth transistor T6, the ninth transistor T9, and the tenth transistor T10 may be turned on. Because the pre-lighting voltage having the lighting voltage level is applied via the pre-lighting test pad PAD, and the third transistor T3, the sixth transistor T6, the ninth transistor T9, and the tenth transistor T10 are turned on, the pre-lighting voltage having the lighting voltage level may be applied to the first red sub-pixel R, the first green sub-pixels G, the first blue sub-pixel B, the second red sub-pixel R, the second green sub-pixels G, and the second blue sub-pixel B via the first data line DL1, the second data line DL2, the third data line DL3, and the fourth data line DL4, respectively. Accordingly, the first red sub-pixel R, the first green sub-pixels G, the first blue sub-pixel B, the second red sub-pixel R, the second green sub-pixels G, and the second blue sub-pixel B may emit light. Thus, the display panel test circuit 200-4 may perform the pre-lighting test on the display panel 100 by checking whether the first red sub-pixel R, the first green sub-pixels G, the first blue sub-pixel B, the second red sub-pixel R, the second green sub-pixels G, and the second blue sub-pixel B emit light.

The display panel test circuit 200-4 may have a structure in which at least two test circuits among the pre-lighting test circuit that performs the pre-lighting test on the display panel 100, the lighting test circuit that performs the lighting test on the display panel 100, the open-short test circuit that performs the open-short test on the display panel 100, and the crack test circuit that performs the crack test on the display panel 100 are integrated. Thus, the display panel 100 including the display panel test circuit 200-4 may have a reduced dead space of the display panel 100 as compared to a conventional display panel that includes a display panel test circuit having a structure in which the pre-lighting test circuit, the lighting test circuit, the open-short test circuit, and the crack test circuit are individually and independently configured. In other words, the display panel test circuit 200-4 may perform the pre-lighting test, the lighting test, the open-short test, and the crack test on the display panel 100 based on the structure in which the pre-lighting test circuit, the lighting test circuit, the open-short test circuit, and the crack test circuit are integrated. Thus, the display panel test circuit 200-4 may have a reduced number of transistors as compared to the conventional display panel test circuit having the structure in which the pre-lighting test circuit, the lighting test circuit, the open-short test circuit, and the crack test circuit are individually and independently configured, and thus may reduce the dead space of the display panel 100.

Although it is illustrated in FIG. 6 that the first to tenth transistors T1~T10 are implemented by PMOS transistors, the present disclosure is not limited thereto. For example, the first to tenth transistors T1~T10 may be implemented by NMOS transistors. For example, a portion of the first to tenth transistors T1~T10 may be implemented by PMOS transistors, and the rest of the first to tenth transistors T1~T10 may be implemented by NMOS transistors. It is understood that the voltage level applied to the gate terminals of the first to tenth transistors T1~T10 may be correspondingly changed depending on the type (e.g., PMOS or NMOS) of the first to tenth transistors T1~T10.

Figure 7:
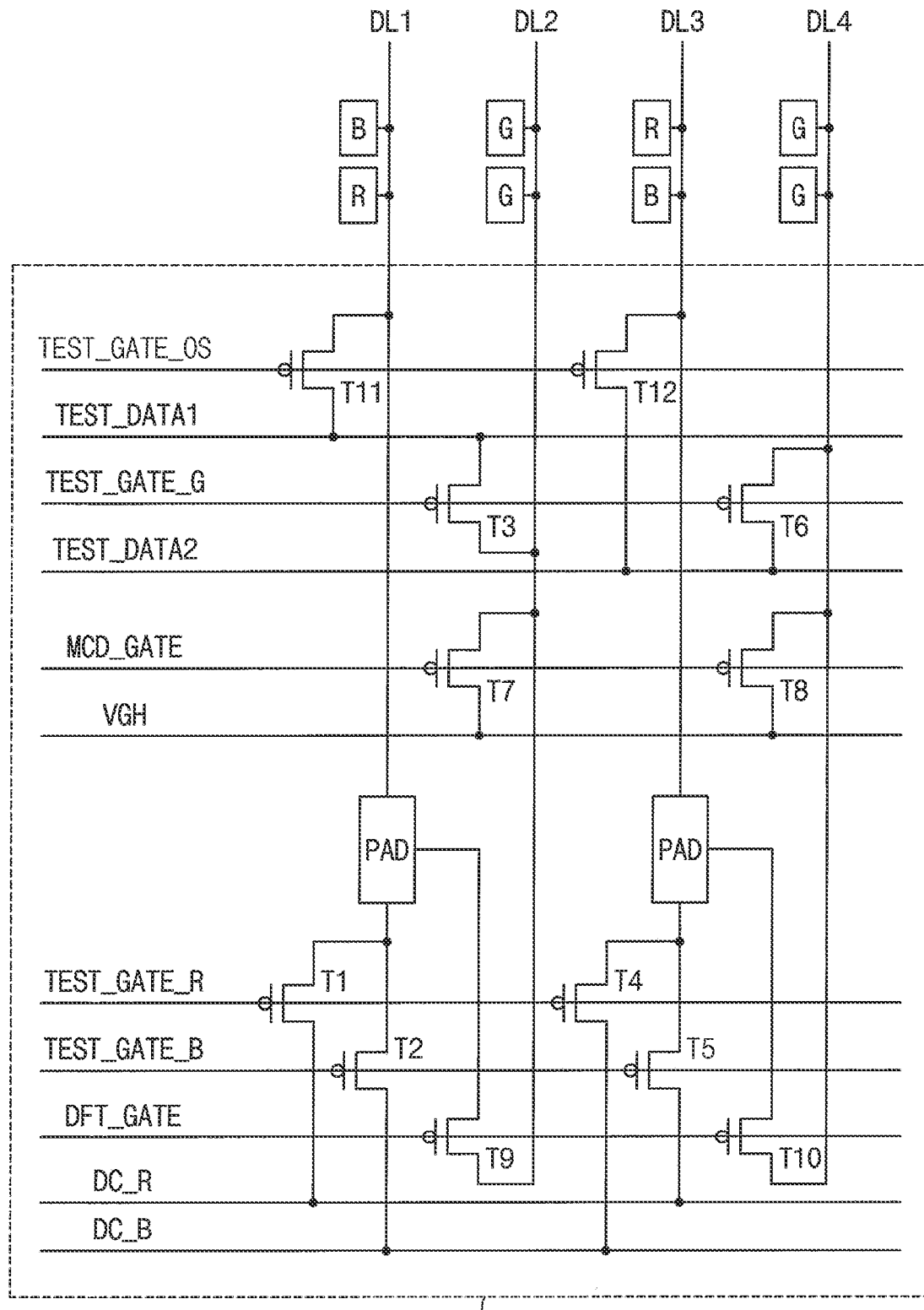
FIG. 7 is a circuit diagram of a display panel test circuit included in the display panel of FIG. 1 according to yet another embodiment.

FIG. 7 is a circuit diagram of a display panel test circuit included in the display panel 100 of FIG. 1 according to yet another embodiment, and FIG. 8 is a diagram for describing an operation of the display panel test circuit of FIG. 7.

Referring to FIGS. 7 and 8, a display panel test circuit 200-5 may include a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, and a twelfth transistor T12. The display panel test circuit 200-5 is illustrated with respect to two adjacent pixels connected to one data line among the four adjacent data lines DL1, DL2, DL3, and DL4 in FIG. 7, and it should be understood that the display panel test circuit 200-5 has a structure in which a configuration illustrated in FIG. 7 is repeatedly arranged.

The first transistor T1 may include a first terminal connected to a first data line DL1 to which a first red sub-pixel R and a first blue sub-pixel B are connected, a gate terminal that receives a red lighting test signal TEST_GATE_R, and a second terminal connected to a red lighting voltage line that supplies a red lighting voltage DC_R. The first transistor T1 may transfer the red lighting voltage DC_R to the first data line DL1 when the red lighting test signal TEST_GATE_R has a turn-on voltage level. The second transistor T2 may include a first terminal connected to the first data line DL1 to which the first red sub-pixel R and the first blue sub-pixel B are connected, a gate terminal that receives a blue lighting test signal TEST_GATE_B, and a second terminal connected to a blue lighting voltage line that supplies a blue lighting voltage DC_B. The second transistor T2 may transfer the blue lighting voltage DC_B to the first data line DL1 when the blue lighting test signal TEST_GATE_B has a turn-on voltage level. The third transistor T3 may include a first terminal connected to a second data line DL2 to which first green sub-pixels G are connected, a gate terminal that receives a green lighting test signal TEST_GATE_G, and a second terminal connected to a first test voltage line that supplies a first test voltage TEST_DATA_1. The third transistor T3 may transfer the first test voltage TEST_DATA1 to the second data line DL2 when the green lighting test signal TEST_GATE_G has a turn-on voltage level.

The fourth transistor T4 may include a first terminal connected to a third data line DL3 to which a second red sub-pixel R and a second blue sub-pixel B are connected, a gate terminal that receives the red lighting test signal TEST_GATE_R, and a second terminal connected to the blue lighting voltage line that supplies the blue lighting voltage DC_B. The fourth transistor T4 may transfer the blue lighting voltage DC_B to the third data line DL3 when the red lighting test signal TEST_GATE_R has a turn-on voltage level. The fifth transistor T5 may include a first terminal connected to the third data line DL3 to which the second red sub-pixel R and the second blue sub-pixel B are connected, a gate terminal that receives the blue lighting test signal TEST_GATE_B, and a second terminal connected to the red lighting voltage line that supplies the red lighting voltage DC_R. The fifth transistor T5 may transfer the red lighting voltage DC_R to the third data line DL3 when the blue lighting test signal TEST_GATE_B has a turn-on voltage level. The sixth transistor T6 may include a first terminal connected to a fourth data line DL4 to which second green sub-pixels G are connected, a gate terminal that receives the green lighting test signal TEST_GATE_G, and a second terminal connected to a second test voltage line that supplies a second test voltage TEST_DATA2. The sixth transistor T6 may transfer the second test voltage TEST_DATA2 to the fourth data line DL4 when the green lighting test signal TEST_GATE_G has a turn-on voltage level.

The seventh transistor T7 may include a first terminal connected to the second data line DL2 to which the first green sub-pixels G are connected, a gate terminal that receives a crack test signal MCD_GATE, and a second terminal connected to a crack detection line VGH. The seventh transistor T7 may transfer a voltage of the crack detection line VGH to the second data line DL2 when the crack test signal MCD_GATE has a turn-on voltage level. The eighth transistor T8 may include a first terminal connected to the fourth data line DL4 to which the second green sub-pixels G are connected, a gate terminal that receives the crack test signal MCD_GATE, and a second terminal connected to the crack detection line VGH. The eighth transistor T8 may transfer the voltage of the crack detection line VGH to the fourth data line DL4 when the crack test signal MCD_GATE has a turn-on voltage level. The crack detection line VGH may pass through the non-display region 120 of the display panel 100. The crack detection line VGH may be connected to the red lighting voltage line, the blue lighting voltage line, or the green lighting voltage line and may be connected to both the seventh transistor T7 and the eighth transistor T8.

The ninth transistor T9 may include a first terminal connected to the second data line DL2 to which the first green sub-pixels G are connected, a gate terminal that receives a pre-lighting test signal DFT_GATE, and a second terminal connected to a first pre-lighting test pad PAD that is connected to the first data line DLL The ninth transistor T9 may transfer a pre-lighting voltage having a lighting voltage level that is applied via the first pre-lighting test pad PAD to the second data line DL2 when the pre-lighting test signal DFT_GATE has a turn-on voltage level. The tenth transistor T10 may include a first terminal connected to the fourth data line DL4 to which the second green sub-pixels G are connected, a gate terminal that receives the pre-lighting test signal DFT_GATE, and a second terminal connected to a second pre-lighting test pad PAD that is connected to the third data line DL3. The tenth transistor T10 may transfer the pre-lighting voltage having the lighting voltage level that is applied via the second pre-lighting test pad PAD to the fourth data line DL4 when the pre-lighting test signal DFT_GATE has a turn-on voltage level.

The eleventh transistor T11 may include a first terminal connected to the first data line DL1 to which the first red sub-pixel R and the first blue sub-pixel B are connected, a gate terminal that receives an open-short test signal TEST_GATE_OS, and a second terminal connected to the first test voltage line that supplies the first test voltage TEST_DATA_1. The eleventh transistor T11 may transfer the first test voltage TEST_DATA1 to the first data line DL1 when the open-short test signal TEST_GATE_OS has a turn-on voltage level. The twelfth transistor T12 may include a first terminal connected to the third data line DL3 to which the second red sub-pixel R and the second blue sub-pixel B are connected, a gate terminal that receives the open-short test signal TEST_GATE_OS, and a second terminal connected to the second test voltage line that supplies the second test voltage TEST_DATA2. The twelfth transistor T12 may transfer the second test voltage TEST_DATA2 to the third data line DL3 when the open-short test signal TEST_GATE_OS has a turn-on voltage level. In the embodiment illustrated in FIG. 8, the display panel test circuit 200-5 may perform the pre-lighting test (i.e., DFT TEST), the lighting test (i.e., DC LIGHTING TEST), the open-short test (i.e., OS TEST1 and OS TEST2), and the crack test (i.e., MCD TEST) on the display panel 100 using the first to twelfth transistors T1~T12.

In an embodiment, when the display panel test circuit 200-5 performs the lighting test (i.e., DC LIGHTING TEST) on the display panel 100, the red lighting test signal TEST_GATE_R, the blue lighting test signal TEST_GATE_B, the green lighting test signal TEST_GATE_G may have a turn-on voltage level (e.g., indicated by L), the red lighting voltage DC_R and the blue lighting voltage DC_B may have a lighting voltage level (e.g., indicated by L), the crack test signal MCD_GATE may have a turn-off voltage level (e.g., indicated by H), the open-short test signal TEST_GATE_OS may have a turn-off voltage level (e.g., indicated by H), the first test voltage TEST_DATA1 and the second test voltage TEST_DATA2 may have a lighting voltage level (e.g., indicated by L), and the pre-lighting test signal DFT_GATE may have a turn-off voltage level (e.g., indicated by H). Thus, the first transistor T1, the second transistor T2, the third transistor T3, the fourth transistor T4, the fifth transistor T5, and the sixth transistor T6 may be turned on (e.g., the first transistor T1 and the second transistor T2 may be alternately turned on, and the fourth transistor T4 and the fifth transistor T5 may be alternately turned on), and the seventh transistor T7, the eighth transistor T8, the ninth transistor T9, the tenth transistor T10, the eleventh transistor T11, and the twelfth transistor T12 may be turned off.

During the lighting test, the first red sub-pixel R and the second red sub-pixel R may emit light because the first transistor T1 that is turned on by the red lighting test signal TEST_GATE_R having the turn-on voltage level applies the red lighting voltage DC_R that has a lighting voltage level to the first red sub-pixel R via the first data line DL1, and the fourth transistor T4 that is turned on by the red lighting test signal TEST_GATE_R having the turn-on voltage level applies the red lighting voltage DC_R that has the lighting voltage level to the second red sub-pixel R via the third data line DL3. In addition, the first blue sub-pixel B and the second blue sub-pixel B may emit light because the second transistor T2 that is turned on by the blue lighting test signal TEST_GATE_B having the turn-on voltage level applies the blue lighting voltage DC_B that has a lighting voltage level to the first blue sub-pixel B via the first data line D1, and the fifth transistor T5 that is turned on by the blue lighting test signal TEST_GATE_B having the turn-on voltage level applies the blue lighting test signal TEST_GATE_B having the turn-on voltage level applies the blue lighting voltage DC_B that has the lighting voltage level to the second blue sub-pixel B via the third data line DL3. Further, the first green sub-pixels G and the second green sub-pixels G may emit light because the eleventh transistor T11 and the twelfth transistor T12 apply the first test voltage TEST_DATA1 and the second test voltage TEST_DATA2 that have a lighting voltage level to the first green sub-pixels G and the second green sub-pixels G via the second data line DL2 and the fourth data line DL4, respectively. Thus, the display panel test circuit 200-5 may perform the lighting test (i.e., DC LIGHTING TEST) on the display panel 100 by checking whether the first red sub-pixel R, the first blue sub-pixel B, the first green sub-pixels G, the second red sub-pixel R, the second blue sub-pixel B, and the second green sub-pixels G emit light.

In an embodiment, when the display panel test circuit 200-5 performs a first open-short test (i.e., OS TEST1) on the display panel 100, the green lighting test signal TEST_GATE_G may have a turn-on voltage level (e.g., indicated by L), the red lighting test signal TEST_GATE_R and the blue lighting test signal TEST_GATE_B may have a turn-off voltage level (e.g., indicated by H), the red lighting voltage DC_R and the blue lighting voltage DC_B may have a non-lighting voltage level (e.g., indicated by H), the crack test signal MCD_GATE may have a turn-off voltage level (e.g., indicated by H), the open-short test signal TEST_GATE_OS may have a turn-on voltage level (e.g., indicated by L), the first test voltage TEST_DATA1 may have a non-lighting voltage level (e.g., indicated by H), the second test voltage TEST_DATA2 may have a lighting voltage level (e.g., indicated by L), and the pre-lighting test signal DFT_GATE may have a turn-off voltage level (e.g., indicated by H). Thus, the third transistor T3, the sixth transistor T6, the eleventh transistor T11, and the twelfth transistor T12 may be turned on, and the first transistor T1, the second transistor T2, the fourth transistor T4, the fifth transistor T5, the seventh transistor T7, the eighth transistor T8, the ninth transistor T9, and the tenth transistor T10 may be turned off.

During the first open-short test, the first green sub-pixels G that are connected to the second data line DL2 to which the first test voltage TEST_DATA1 is applied via the third transistor T3 may not emit light because the first test voltage TEST_DATA1 has a non-lighting voltage level, and the seventh transistor T7 and the ninth transistor T9 are turned off. In addition, the first red sub-pixel R and the first blue sub-pixel B that are connected to the first data line DL1 to which the first test voltage TEST_DATA1 is applied via the eleventh transistor T11 may not emit light because the first test voltage TEST_DATA1 has a non-lighting voltage level. and the first transistor T1 and the second transistor T2 are turned off. On the other hand, the second green sub-pixels G that are connected to the fourth data line DL4 to which the second test voltage TEST_DATA2 is applied via the sixth transistor T6 may emit light because the second test voltage TEST_DATA2 has a lighting voltage level. Further, the second red sub-pixel R and the second blue sub-pixel B that are connected to the third data line DL3 to which the second test voltage TEST_DATA2 is applied via the twelfth transistor T12 may emit light because the second test voltage TEST_DATA2 has a lighting voltage level. Thus, the display panel test circuit 200-5 may perform the first open-short test (i.e., OS TEST1) on the display panel 100 by checking whether the first red sub-pixel R, the first blue sub-pixel B, the first green sub-pixels G, the second red sub-pixel R, the second blue sub-pixel B, and the second green sub-pixels G emit light.

In an embodiment, when the display panel test circuit 200-5 performs a second open-short test (i.e., OS TEST2) on the display panel 100, the green lighting test signal TEST_GATE_G may have a turn-on voltage level (e.g., indicated by L), the red lighting test signal TEST_GATE_R and the blue lighting test signal TEST_GATE_B may have a turn-off voltage level (e.g., indicated by H), the red lighting voltage DC_R and the blue lighting voltage DC_B may have a non-lighting voltage level (e.g., indicated by H), the crack test signal MCD_GATE may have a turn-off voltage level (e.g., indicated by H), the open-short test signal TEST_GATE_OS may have a turn-on voltage level (e.g., indicated by L), the first test voltage TEST_DATA1 may have a lighting voltage level (e.g., indicated by L), the second test voltage TEST_DATA2 may have a non-lighting voltage level (e.g., indicated by H), and the pre-lighting test signal DFT_GATE may have a turn-off voltage level (e.g., indicated by H). Thus, the third transistor T3, the sixth transistor T6, the eleventh transistor T11, and the twelfth transistor T12 may be turned on, and the first transistor T1, the second transistor T2, the fourth transistor T4, the fifth transistor T5, the seventh transistor T7, the eighth transistor T8, the ninth transistor T9, and the tenth transistor T10 may be turned off.

During the second open-short test, the first green sub-pixels G that are connected to the second data line DL2 to which the first test voltage TEST_DATA1 is applied via the third transistor T3 may emit light because the first test voltage TEST_DATA1 has a lighting voltage level. In addition, the first red sub-pixel R and the first blue sub-pixel B that are connected to the first data line DL1 to which the first test voltage TEST_DATA1 is applied via the eleventh transistor T11 may emit light because the first test voltage TEST_DATA1 has a lighting voltage level. On the other hand, the second green sub-pixels G that are connected to the fourth data line DL4 to which the second test voltage TEST_DATA2 is applied via the sixth transistor T6 may not emit light because the second test voltage TEST_DATA2 has a non-lighting voltage level, and the eighth transistor T8 and the tenth transistor T10 are turned off. Further, the second red sub-pixel R and the second blue sub-pixel B that are connected to the third data line DL3 to which the second test voltage TEST_DATA2 is applied via the twelfth transistor T12 may not emit light because the second test voltage TEST_DATA2 has a non-lighting voltage level, and the fourth transistor T4 and the fifth transistor T5 are turned off. Thus, the display panel test circuit 200-5 may perform the second open-short test (i.e., OS TEST2) on the display panel 100 by checking whether the first red sub-pixel R, the first blue sub-pixel B, the first green sub-pixels G, the second red sub-pixel R, the second blue sub-pixel B, and the second green sub-pixels G emit light.

In an embodiment, when the display panel test circuit 200-5 performs a crack test (i.e., MCD TEST) on the display panel 100, the red lighting test signal TEST_GATE_R, the green lighting test signal TEST_GATE_G, and the blue lighting test signal TEST_GATE_B may have a turn-off voltage level (e.g., indicated by H), the red lighting voltage DC_R and the blue lighting voltage DC_B may have a non-lighting voltage level (e.g., indicated by H), the crack test signal MCD_GATE may have a turn-on voltage level (e.g., indicated by L), the open-short test signal TEST_GATE_OS may have a turn-on voltage level (e.g., indicated by L), the first test voltage TEST_DATA1 and the second test voltage TEST_DATA2 may have a non-lighting voltage level (e.g., indicated by H), the pre-lighting test signal DFT_GATE may have a turn-off voltage level (e.g., indicated by H), and the voltage of the crack detection line VGH may have a non-lighting voltage level (e.g., indicated by H). Thus, the seventh transistor T7, the eighth transistor T8, the eleventh transistor T11, and the twelfth transistor T12 may be turned on, and the first transistor T1, the second transistor T2, the third transistor T3, the fourth transistor T4, the fifth transistor T5, the sixth transistor T6, the ninth transistor T9, and the tenth transistor T10 may be turned off. As described above, the crack detection line VGH may pass through the non-display region 120 of the display panel 100. The crack detection line VGH may be connected to the red lighting voltage line, the blue lighting voltage line, or the green lighting voltage line and may be connected to both the seventh transistor T7 and the eighth transistor T8. Thus, when the seventh transistor T7 and the eighth transistor T8 are turned on while a voltage having a non-lighting voltage level is applied to the crack detection line VGH, the first green sub-pixels G connected to the second data line DL2 and the second green sub-pixels G connected to the fourth data line DL4 may not emit light. Thus, if the first green sub-pixels G connected to the second data line DL2 and/or the second green sub-pixels G connected to the fourth data line DL4 emit light as the seventh transistor T7 and the eighth transistor T8 are turned on while a voltage having a non-lighting voltage level is applied to the crack detection line VGH, it may be determined that a crack may have occurred in the non-display region 120 of the display panel 100. In this way, the display panel test circuit 200-5 may perform the crack test (i.e., MCD TEST) on the display panel 100.

In an embodiment, when the display panel test circuit 200-5 performs a pre-lighting test (i.e., DFT TEST) on the display panel 100, the red lighting test signal TEST_GATE_R, the blue lighting test signal TEST_GATE_B, and the green lighting test signal TEST_GATE_G may have a turn-off voltage level (e.g., indicated by H), the red lighting voltage DC_R and the blue lighting test DC_B may have a non-lighting voltage level (e.g., indicated by H), the crack test signal MCD_GATE may have a turn-off voltage level (e.g., indicated by H), the open-short test signal TEST_GATE_OS may have a turn-off voltage level (e.g., indicated by H), the first test voltage TEST_DATA1 and the second test voltage TEST_DATA2 may have a non-lighting voltage level (e.g., indicated by H), the pre-lighting test signal DFT_GATE may have a turn-on voltage level (e.g., indicated by L), and the pre-lighting voltage having the lighting voltage level may be applied via the pre-lighting test pad PAD. Thus, the first transistor T1, the second transistor T2, the third transistor T3, the fourth transistor T4, the fifth transistor T5, the sixth transistor T6, the seventh transistor T7, the eighth transistor T8, the eleventh transistor T11, and the twelfth transistor T12 may be turned off, and the ninth transistor T9 and the tenth transistor T10 may be turned on.

During the pre-lighting test, the pre-lighting voltage having the lighting voltage level is applied via the pre-lighting test pad PAD. Because the ninth transistor T9 and the tenth transistor T10 are turned on, the pre-lighting voltage having the lighting voltage level may be applied to the first red sub-pixel R, the first green sub-pixels G, the first blue sub-pixel B, the second red sub-pixel R, the second green sub-pixels G, and the second blue sub-pixel B via the first data line DL1, the second data line DL2, the third data line DL3, and the fourth data line DL4, respectively. Accordingly, the first red sub-pixel R, the first green sub-pixels G, the first blue sub-pixel B, the second red sub-pixel R, the second green sub-pixels G, and the second blue sub-pixel B may emit light. Thus, the display panel test circuit 200-5 may perform the pre-lighting test (i.e., DFT TEST) on the display panel 100 by checking whether the first red sub-pixel R, the first green sub-pixels G, the first blue sub-pixel B, the second red sub-pixel R, the second green sub-pixels G, and the second blue sub-pixel B emit light.

The display panel test circuit 200-5 may have a structure in which at least two test circuits among the pre-lighting test circuit that performs the pre-lighting test (i.e., DFT TEST) on the display panel 100, the lighting test circuit that performs the lighting test (i.e., DC LIGHTING TEST) on the display panel 100, the open-short test circuit that performs the open-short test (i.e., OS TEST1 and OS TEST2) on the display panel 100, and the crack test circuit that performs the crack test (i.e., MCD TEST) on the display panel 100 are integrated. Thus, the display panel 100 including the display panel test circuit 200-5 may have a reduced dead space of the display panel 100 as compared to a conventional display panel that includes a display panel test circuit having a structure in which the pre-lighting test circuit, the lighting test circuit, the open-short test circuit, and the crack test circuit are individually and independently configured. In other words, the display panel test circuit 200-5 may perform the pre-lighting test (i.e., DFT TEST), the lighting test (i.e., DC LIGHTING TEST), the open-short test (i.e., OS TEST1 and OS TEST2), and the crack test (i.e., MCD TEST) on the display panel 100 based on the structure in which the pre-lighting test circuit, the lighting test circuit, the open-short test circuit, and the crack test circuit are integrated. Thus, the display panel test circuit 200-5 may have a reduced number of transistors as compared to the conventional display panel test circuit having the structure in which the pre-lighting test circuit, the lighting test circuit, the open-short test circuit, and the crack test circuit are individually and independently configured, and thus may reduce the dead space of the display panel 100. Although it is illustrated in FIG. 7 that the first to twelfth transistors T1~T12 are implemented by PMOS transistors, the present disclosure is not limited thereto. For example, the first to twelfth transistors T1~T12 may be implemented by NMOS transistors. For example, a portion of the first to twelfth transistors T1~T12 may be implemented by PMOS transistors, and the rest of the first to twelfth transistors T1~T12 may be implemented by NMOS transistors. It is understood that the voltage level applied to the gate terminals of the first to twelfth transistors T1~T12 may be correspondingly changed depending on the type (e.g., PMOS or NMOS) of the first to twelfth transistors T1~T12.

Figure 9:
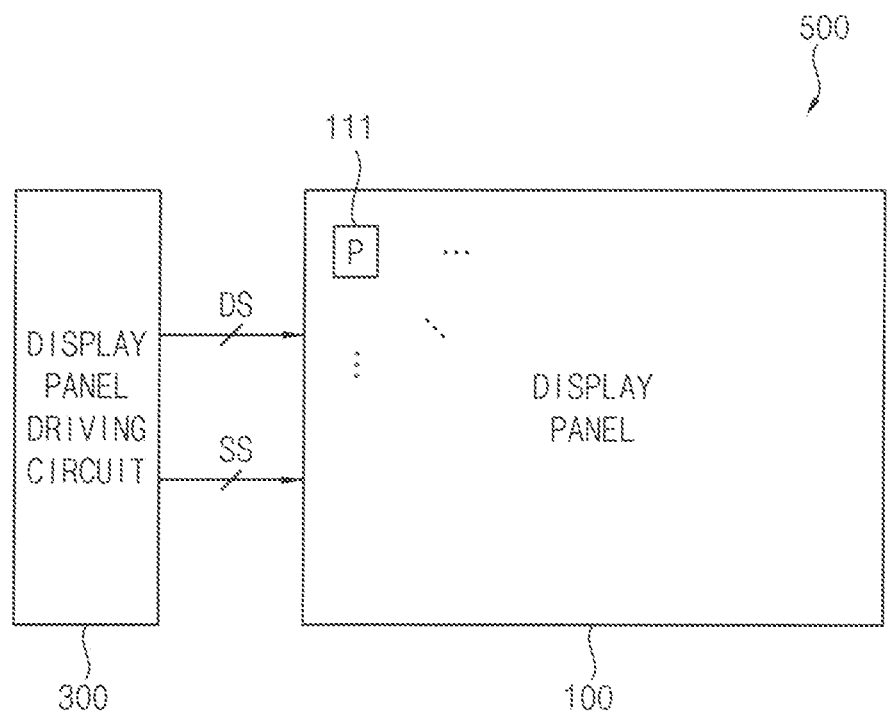
FIG. 9 is a block diagram of a display device according to an embodiment.

FIG. 9 is a block diagram of a display device according to an embodiment.

Referring to FIG. 9, a display device 500 may include the display panel 100 of FIG. 1 and a display panel driving circuit 300. In an embodiment, the display device 500 may be an organic light emitting display device. In another embodiment, the display device 500 may be a liquid crystal display device. However, the present disclosure is not limited thereto. The display panel 100 may include a plurality of pixels 111. Here, each of the pixels 111 may have a pentile structure in which one red sub-pixel, one blue sub-pixel, and two green sub-pixels are arranged. The display panel driving circuit 300 may drive the display panel 100. In an embodiment, the display panel driving circuit 300 may include a scan driver, a data driver, and a timing controller. The scan driver may be electrically connected to the display panel 100 via scan lines. The scan driver may provide a scan signal SS to the pixels 111 included in the display panel 100. The data driver may be electrically connected to the display panel 100 via data lines. The data driver may provide a data signal DS to the pixels 111 included in the display panel 100. The timing controller may control the scan driver and the data driver. In some embodiments, the timing controller may compensate for an image data that is input from an external component (e.g., deterioration compensation and the like) to generate the data signal DS.

The display panel 100 may include the display panel test circuit 200 (e.g., the display panel test circuits 200-1 of FIG. 2, the display panel test circuits 200-2 of FIG. 4, the display panel test circuits 200-3 of FIG. 5, the display panel test circuits 200-4 of FIG. 6, and the display panel test circuits 200-5 of FIG. 7) that is provided (or mounted) in the non-display region 120 of the display panel 100 as shown in FIG. 1. The display panel test circuit 200 may have a structure in which a lighting test circuit that performs a lighting test on the display panel 100, an open-short test circuit that performs an open-short test on the display panel 100, and a crack test circuit that performs a crack test on the display panel 100 are integrated or a structure in which a pre-lighting test circuit that performs a pre-lighting test on the display panel 100, a lighting test circuit that performs a lighting test on the display panel 100, an open-short test circuit that performs an open-short test on the display panel 100, and a crack test circuit that performs a crack test on the display panel are integrated. Thus, when the display panel test circuit 200 is provided in the non-display region 120 of the display panel 100, the display panel 100 including the display panel test circuit 200 may have a reduced dead space as compared to a conventional display panel that includes a display panel test circuit having a structure in which the lighting test circuit, the open-short test circuit, and the crack test circuit are individually and independently configured or a structure in which the pre-lighting test circuit, the lighting test circuit, the open-short test circuit, and the crack test circuit are individually and independently configured. In an embodiment, the display panel test circuit 200 may have a structure of the display panel test circuit 200-1 illustrated in FIG. 2. In another embodiment, the display panel test circuit 200 may have a structure of the display panel test circuit 200-2 illustrated in FIG. 4. In still another embodiment, the display panel test circuit 200 may have a structure of the display panel test circuit 200-3 illustrated in FIG. 5. In still another embodiment, the display panel test circuit may have a structure of the display panel test circuit 200-4 illustrated in FIG. 6. In still another embodiment, the display panel test circuit may have a structure of the display panel test circuit 200-5 illustrated in FIG. 7. Since these are described above, duplicated description related thereto will not be repeated.

Figure 10:
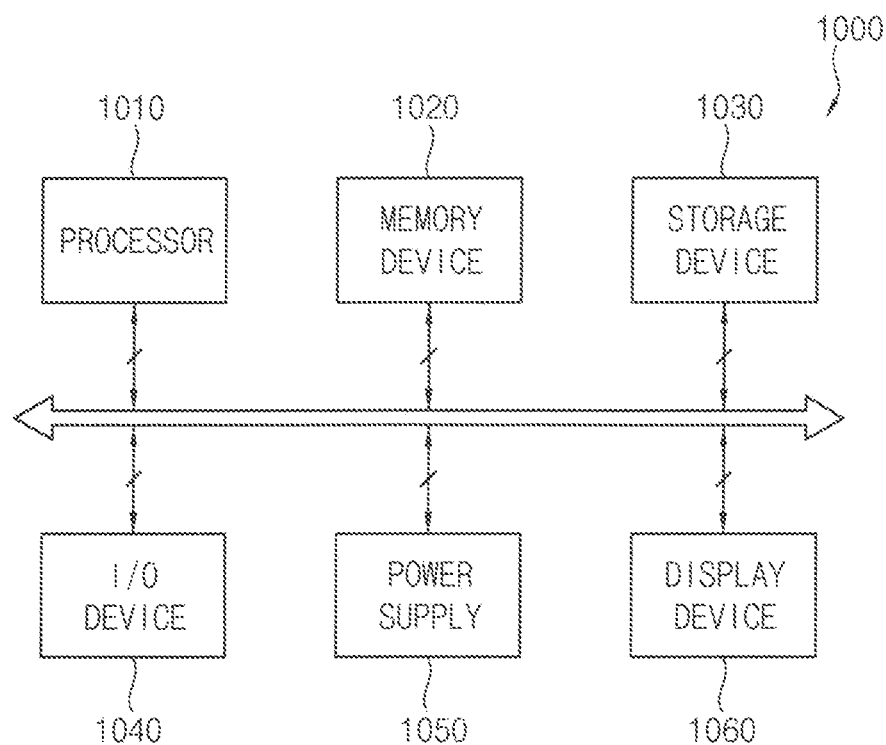
FIG. 10 is a block diagram of an electronic device according to an embodiment.
Figure 11:
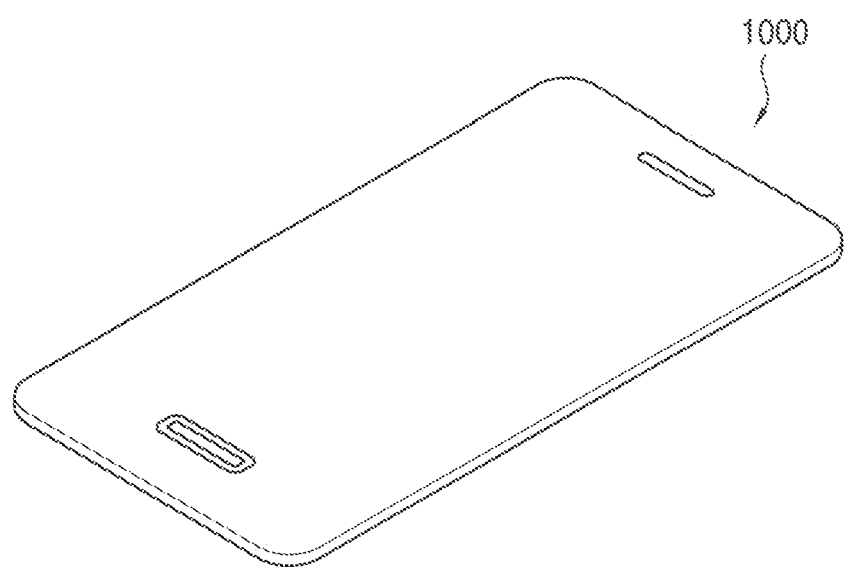
FIG. 11 illustrates an example of the electronic device of FIG. 10 implemented as a smart phone.

FIG. 10 is a block diagram of an electronic device according to an embodiment, and FIG. 11 illustrates an example of the electronic device of FIG. 10 implemented as a smart phone.

Referring to FIGS. 10 and 11, an electronic device 1000 may include a processor 1010, a memory device 1020, a storage device 1030, an input/output (I/O) device 1040, a power supply 1050, and a display device 1060. The display device 1060 may be the display device 500 of FIG. 9. In addition, the electronic device 1000 may further include a plurality of ports for communicating with a video card, a sound card, a memory card, a universal serial bus (USB) device, other electronic devices, etc. As illustrated in FIG. 11, the electronic device 1000 may be implemented as a smart phone. However, the present disclosure is not limited thereto. For example, the electronic device 1000 may be implemented as a cellular phone, a video phone, a smart pad, a smart watch, a tablet PC, a car navigation system, a computer monitor, a laptop computer, a head mounted display (HMD) device, or the like.

The processor 1010 may perform various computing tasks. The processor 1010 may be a micro-processor, a central processing unit (CPU), an application processor (AP), or the like. The processor 1010 may be coupled to other components via an address bus, a control bus, a data bus, etc. Further, the processor 1010 may be coupled to an extended bus such as a peripheral component interconnection (PCI) bus. The memory device 1020 may store data of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, or the like and/or at least one volatile memory device such as a dynamic random access memory (DRAM) device, a static random access memory (SRAM) device, a mobile DRAM device, or the like. The storage device 1030 may include a solid state drive (SSD) device, a hard disk drive (HDD) device, a CD-ROM device, or the like. The I/O device 1040 may include an input device such as a keyboard, a keypad, a mouse device, a touch-pad, a touch-screen, or the like and an output device such as a printer, a speaker, or the like. In some embodiments, the display device 1060 may be included as the I/O device 1040. The power supply 1050 may provide power for operating the electronic device 1000.

The display device 1060 may display images corresponding to visual information of the electronic device 1000. The display device 1060 may be coupled to other components via the buses or other communication links. The display device 1000 may include a display panel (e.g., the display panel 100 of FIG. 1) including a plurality of pixels (e.g., each of the pixels has a pentile structure in which one red sub-pixel, one blue sub-pixel, and two green sub-pixels are arranged) and a display panel driving circuit (e.g., the display panel driving circuit 300 of FIG. 9) that drives the display panel. The display panel may include a display panel test circuit (e.g., the display panel test circuit 200 of FIG. 1) provided in a non-display region of the display panel. The display panel test circuit may have a structure in which a lighting test circuit that performs a lighting test on the display panel, an open-short test circuit that performs an open-short test on the display panel, and a crack test circuit that performs a crack test on the display panel are integrated or a structure in which a pre-lighting test circuit that performs a pre-lighting test on the display panel, a lighting test circuit that performs a lighting test on the display panel, an open-short test circuit that performs an open-short test on the display panel, and a crack test circuit that performs a crack test on the display panel are integrated. Thus, the display panel including the display panel test circuit may have a reduced dead space, and the bezel corresponding to the dead space may be reduced as compared to a conventional display panel that includes a display panel test circuit having a structure in which the lighting test circuit, the open-short test circuit, and the crack test circuit are individually and independently configured or a structure in which the pre-lighting test circuit, the lighting test circuit, the open-short test circuit, and the crack test circuit are individually and independently configured. Since these are described above with reference to FIGS. 2 to 8, duplicated description related thereto will not be repeated. Thus, the display device 1060 that includes the display panel having a reduced (or minimized) dead space may have a reduced (or minimized) bezel and thus may have an elegant design.

The present inventive concept may be applied to a display device and an electronic device including the display device. For example, the present inventive concept may be applied to a smart phone, a cellular phone, a video phone, a smart pad, a smart watch, a tablet PC, a car navigation system, a television, a computer monitor, a laptop computer, a head mounted display (HMD) device, an MP3 player, and the like.

The foregoing is illustrative of embodiments of the present disclosure and is not to be construed as limiting thereof. Although some embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments of the present disclosure and is not to be construed as limited to the specific embodiments disclosed herein, and that modifications to the disclosed embodiments, as well as other embodiments, are intended to be included within the scope of the present disclosure including the appended claims.

What is claimed is:

1. A display panel test circuit comprising:
   a first transistor including a first terminal connected to a first data line to which a first red sub-pixel and a first blue sub-pixel are connected, a gate terminal that receives a red lighting test signal, and a second terminal connected to a red lighting voltage line that supplies a red lighting voltage;
   a second transistor including a first terminal connected to the first data line, a gate terminal that receives a blue lighting test signal, and a second terminal connected to a blue lighting voltage line that supplies a blue lighting voltage;
   a third transistor including a first terminal connected to a second data line to which first green sub-pixels are connected, a gate terminal that receives a first green lighting test signal, and a second terminal connected to a green lighting voltage line that supplies a green lighting voltage;
   a fourth transistor including a first terminal connected to a third data line to which a second red sub-pixel and a second blue sub-pixel are connected, a gate terminal that receives the red lighting test signal, and a second terminal connected to the blue lighting voltage line;
   a fifth transistor including a first terminal connected to the third data line, a gate terminal that receives the blue lighting test signal, and a second terminal connected to the red lighting voltage line;
   a sixth transistor including a first terminal connected to a fourth data line to which second green sub-pixels are connected, a gate terminal that receives a second green lighting test signal, and a second terminal connected to the green lighting voltage line;
   a seventh transistor including a first terminal connected to the second data line, a gate terminal that receives a crack test signal, and a second terminal connected to a crack detection line that passes through a non-display region of a display panel; and
   an eighth transistor including a first terminal connected to the fourth data line, a gate terminal that receives the crack test signal, and a second terminal connected to the crack detection line.

2. The display panel test circuit of claim 1, wherein the display panel test circuit performs a lighting test on the display panel based on the red lighting test signal, the blue lighting test signal, the first green lighting test signal, and the second green lighting test signal having a turn-on voltage level, the red lighting voltage, the blue lighting voltage, and the green lighting voltage having a lighting voltage level, and the crack test signal having a turn-off voltage level.

3. The display panel test circuit of claim 1, wherein the display panel test circuit performs a first open-short test on the display panel based on the red lighting test signal and the second green lighting test signal having a turn-on voltage level, the first green lighting test signal and the blue lighting test signal having a turn-off voltage level, the red lighting voltage having a non-lighting voltage level, the blue lighting voltage and the green lighting voltage having a lighting voltage level, and the crack test signal having the turn-on voltage level.

4. The display panel test circuit of claim 3, wherein the display panel test circuit performs a second open-short test on the display panel based on the red lighting test signal and the first green lighting test signal having the turn-on voltage level, the second green lighting test signal and the blue lighting test signal having the turn-off voltage level, the blue lighting voltage having the non-lighting voltage level, the red lighting voltage and the green lighting voltage having the lighting voltage level, and the crack test signal having the turn-on voltage level.

5. The display panel test circuit of claim 1, wherein the display panel test circuit performs a crack test on the display panel, one of the red lighting test signal and the blue lighting test signal has a turn-on voltage level, another of the red lighting test signal and the blue lighting test signal has a turn-off voltage level, the first green lighting test signal and the second green lighting test signal have the turn-off voltage level, the red lighting voltage, the blue lighting voltage, and the green lighting voltage have a non-lighting voltage level, and the crack test signal has the turn-on voltage level.

6. The display panel test circuit of claim 1, further comprising:
   a ninth transistor including a first terminal connected to the first data line, a gate terminal that receives a first pre-lighting test signal, and a second terminal connected to a pre-lighting test pad;
   a tenth transistor including a first terminal connected to the second data line, a gate terminal that receives a second pre-lighting test signal, and a second terminal connected to the pre-lighting test pad;
   an eleventh transistor including a first terminal connected to the third data line, a gate terminal that receives a third pre-lighting test signal, and a second terminal connected to the pre-lighting test pad; and
   a twelfth transistor including a first terminal connected to the fourth data line, a gate terminal that receives a fourth pre-lighting test signal, and a second terminal connected to the pre-lighting test pad.

7. The display panel test circuit of claim 6, wherein the display panel test circuit performs a pre-lighting test on the display panel based on the red lighting test signal, the blue lighting test signal, the first green lighting test signal, and the second green lighting test signal having a turn-off voltage level, the crack test signal having the turn-off voltage level, the first pre-lighting test signal, the second pre-lighting test signal, the third pre-lighting test signal, and the fourth pre-lighting test signal having a turn-on voltage level, and a pre-lighting voltage having a lighting voltage level and applied via the pre-lighting test pad.

8. The display panel test circuit of claim 6, wherein the ninth transistor, the tenth transistor, the eleventh transistor, and the twelfth transistor are arranged between the green lighting voltage line and the blue lighting voltage line, between the green lighting voltage line and the red lighting voltage line, or between the blue lighting voltage line and the red lighting voltage line.

9. A display panel test circuit comprising:
   a first transistor including a first terminal connected to a first data line to which a first red sub-pixel and a first blue sub-pixel are connected, a gate terminal that receives a red lighting test signal, and a second terminal connected to a red lighting voltage line that supplies a red lighting voltage;
   a second transistor including a first terminal connected to the first data line, a gate terminal that receives a blue lighting test signal, and a second terminal connected to a blue lighting voltage line that supplies a blue lighting voltage;
   a third transistor including a first terminal connected to a second data line to which first green sub-pixels are connected, a gate terminal that receives a first green lighting test signal, and a second terminal connected to both a pre-lighting test pad and a green lighting voltage line that supplies a green lighting voltage;
   a fourth transistor including a first terminal connected to a third data line to which a second red sub-pixel and a second blue sub-pixel are connected, a gate terminal that receives the red lighting test signal, and a second terminal connected to the blue lighting voltage line;
   a fifth transistor including a first terminal connected to the third data line, a gate terminal that receives the blue lighting test signal, and a second terminal connected to the red lighting voltage line;
   a sixth transistor including a first terminal connected to a fourth data line to which second green sub-pixels are connected, a gate terminal that receives a second green lighting test signal, and a second terminal connected to both the pre-lighting test pad and the green lighting voltage line;
   a seventh transistor including a first terminal connected to the second data line, a gate terminal that receives a crack test signal, and a second terminal connected to a crack detection line that passes through a non-display region of a display panel;
   an eighth transistor including a first terminal connected to the fourth data line, a gate terminal that receives the crack test signal, and a second terminal connected to the crack detection line;
   a ninth transistor including a first terminal connected to the first data line, a gate terminal that receives a first pre-lighting test signal, and a second terminal connected to both the pre-lighting test pad and the green lighting voltage line; and
   a tenth transistor including a first terminal connected to the third data line, a gate terminal that receives a second pre-lighting test signal, and a second terminal connected to both the pre-lighting test pad and the green lighting voltage line.

10. The display panel test circuit of claim 9, wherein the display panel test circuit performs a lighting test on the display panel based on the red lighting test signal, the blue lighting test signal, the first green lighting test signal, and the second green lighting test signal having a turn-on voltage level, the red lighting voltage, the blue lighting voltage, and the green lighting voltage having a lighting voltage level, the crack test signal having a turn-off voltage level, and the first pre-lighting test signal and the second pre-lighting test signal having the turn-off voltage level.

11. The display panel test circuit of claim 9, wherein the display panel test circuit performs a first open-short test on the display panel based on the red lighting test signal and the second green lighting test signal having a turn-on voltage level, the first green lighting test signal and the blue lighting test signal having a turn-off voltage level, the red lighting voltage having a non-lighting voltage level, the blue lighting voltage and the green lighting voltage having a lighting voltage level, the crack test signal having the turn-on voltage level, and the first pre-lighting test signal and the second pre-lighting test signal having the turn-off voltage level.

12. The display panel test circuit of claim 11, wherein the display panel test circuit performs a second open-short test on the display panel based on the red lighting test signal and the first green lighting test signal having the turn-on voltage level, the second green lighting test signal and the blue lighting test signal having the turn-off voltage level, the blue lighting voltage having the non-lighting voltage level, the red lighting voltage and the green lighting voltage having the lighting voltage level, the crack test signal having the turn-on voltage level, and the first pre-lighting test signal and the second pre-lighting test signal having the turn-off voltage level.

13. The display panel test circuit of claim 9, wherein the display panel test circuit performs a crack test on the display panel based on one of the red lighting test signal and the blue lighting test signal having a turn-on voltage level, another of the red lighting test signal and the blue lighting test signal having a turn-off voltage level, the first green lighting test signal and the second green lighting test signal having the turn-off voltage level, the red lighting voltage, the blue lighting voltage, and the green lighting voltage having a non-lighting voltage level, the crack test signal having the turn-on voltage level, and the first pre-lighting test signal and the second pre-lighting test signal having the turn-off voltage level.

14. The display panel test circuit of claim 9, wherein the display panel test circuit performs a pre-lighting test on the display panel based on the red lighting test signal and the blue lighting test signal having a turn-off voltage level, the crack test signal having the turn-off voltage level, the first pre-lighting test signal, the second pre-lighting test signal, the first green lighting test signal, and the second green lighting test signal having a turn-on voltage level, and a pre-lighting voltage having a lighting voltage level and applied via the pre-lighting test pad.

15. A display panel test circuit comprising:
a first transistor including a first terminal connected to a first data line to which a first red sub-pixel and a first blue sub-pixel are connected, a gate terminal that receives a red lighting test signal, and a second terminal connected to a red lighting voltage line that supplies a red lighting voltage;
a second transistor including a first terminal connected to the first data line, a gate terminal that receives a blue lighting test signal, and a second terminal connected to a blue lighting voltage line that supplies a blue lighting voltage;
a third transistor including a first terminal connected to a second data line to which first green sub-pixels are connected, a gate terminal that receives a green lighting test signal, and a second terminal connected to a first test voltage line that supplies a first test voltage;
a fourth transistor including a first terminal connected to a third data line to which a second red sub-pixel and a second blue sub-pixel are connected, a gate terminal that receives the red lighting test signal, and a second terminal connected to the blue lighting voltage line;
a fifth transistor including a first terminal connected to the third data line, a gate terminal that receives the blue lighting test signal, and a second terminal connected to the red lighting voltage line;
a sixth transistor including a first terminal connected to a fourth data line to which second green sub-pixels are connected, a gate terminal that receives the green lighting test signal, and a second terminal connected to a second test voltage line that supplies a second test voltage;
a seventh transistor including a first terminal connected to the second data line, a gate terminal that receives a crack test signal, and a second terminal connected to a crack detection line that passes through a non-display region of a display panel;
an eighth transistor including a first terminal connected to the fourth data line, a gate terminal that receives the crack test signal, and a second terminal connected to the crack detection line;
a ninth transistor including a first terminal connected to the second data line, a gate terminal that receives a pre-lighting test signal, and a second terminal connected to a first pre-lighting test pad that is connected to the first data line;
a tenth transistor including a first terminal connected to the fourth data line, a gate terminal that receives the pre-lighting test signal, and a second terminal connected to a second pre-lighting test pad that is connected to the third data line;
an eleventh transistor including a first terminal connected to the first data line, a gate terminal that receives an open-short test signal, and a second terminal connected to the first test voltage line; and
a twelfth transistor including a first terminal connected to the third data line, a gate terminal that receives the open-short test signal, and a second terminal connected to the second test voltage line.

16. The display panel test circuit of claim 15, wherein the display panel test circuit performs a lighting test on the display panel based on the red lighting test signal, the blue lighting test signal, and the green lighting test signal having a turn-on voltage level, the red lighting voltage and the blue lighting voltage having a lighting voltage level, the crack test signal having a turn-off voltage level, the open-short test signal having the turn-off voltage level, the first test voltage and the second test voltage having the lighting voltage level and the pre-lighting test signal having the turn-off voltage level.

17. The display panel test circuit of claim 15, wherein the display panel test circuit performs a first open-short test on the display panel based on the green lighting test signal having a turn-on voltage level, the red lighting test signal and the blue lighting test signal having a turn-off voltage level, the red lighting voltage and the blue lighting voltage having a non-lighting voltage level, the crack test signal having the turn-off voltage level, the open-short test signal having the turn-on voltage level, the first test voltage having the non-lighting voltage level, the second test voltage having a lighting voltage level, and the pre-lighting test signal having the turn-off voltage level.

18. The display panel test circuit of claim 17, wherein the display panel test circuit performs a second open-short test on the display panel based on the green lighting test signal having the turn-on voltage level, the red lighting test signal and the blue lighting test signal having the turn-off voltage level, the red lighting voltage and the blue lighting voltage having the non-lighting voltage level, the crack test signal having the turn-off voltage level, the open-short test signal having the turn-on voltage level, the first test voltage having the lighting voltage level, the second test voltage having the non-lighting voltage level and the pre-lighting test signal having the turn-off voltage level.

19. The display panel test circuit of claim 15, wherein the display panel test circuit performs a crack test on the display panel based on the red lighting test signal, the green lighting test signal, and the blue lighting test signal having a turn-off voltage level, the red lighting voltage and the blue lighting voltage having a non-lighting voltage level the crack test signal having a turn-on voltage level, the open-short test signal having the turn-on voltage level, the first test voltage and the second test voltage having the non-lighting voltage level, and the pre-lighting test signal having the turn-off voltage level.

20. The display panel test circuit of claim 15, wherein the display panel test circuit performs a pre-lighting test on the display panel based on the red lighting test signal, the green lighting test signal, and the blue lighting test signal having a turn-off voltage level, the red lighting voltage and the blue lighting voltage having a non-lighting voltage level, the crack test signal having the turn-off voltage level, the open-short test signal having the turn-off voltage level, the first test voltage and the second test voltage having the non-lighting voltage level, the pre-lighting test signal having a turn-on voltage level, and a pre-lighting voltage having a lighting voltage level and applied via the pre-lighting test pad.

* * * * *